United States Patent
Uriu et al.

(10) Patent No.: US 6,975,841 B2
(45) Date of Patent: Dec. 13, 2005

(54) DIPLEXER, AND HIGH-FREQUENCY SWITCH AND ANTENNA DUPLEXER USING THE SAME

(75) Inventors: Kazuhide Uriu, Katano (JP); Toru Yamada, Katano (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 570 days.

(21) Appl. No.: 10/288,541

(22) Filed: Nov. 6, 2002

(65) Prior Publication Data
US 2003/0092397 A1 May 15, 2003

(30) Foreign Application Priority Data
Nov. 12, 2001 (JP) .............................. 2001-346162

(51) Int. Cl.[7] ................................................ H04B 1/44
(52) U.S. Cl. ..................... 455/78; 455/552.1; 370/275; 333/103
(58) Field of Search .................... 455/78, 80, 81–83, 455/552.1, 553.1; 370/275, 276; 333/101–103

(56) References Cited

U.S. PATENT DOCUMENTS 6,366,564 B1 * 4/2002 Hiraka et al. ............... 370/275
2001/0004353 A1 * 6/2001 Furutani et al. ............ 370/297

FOREIGN PATENT DOCUMENTS

| EP | 1 003 291 | 5/2000 |
|---|---|---|
| EP | 1 083 672 | 3/2001 |
| EP | 1 152 543 | 11/2001 |
| JP | 2000-349581 | 12/2000 |
| JP | 2001-44885 | 2/2001 |

* cited by examiner

Primary Examiner—Lee Nguyen
(74) Attorney, Agent, or Firm—Wenderoth, Lind & Ponack, L.L.P.

(57) ABSTRACT

A diplexer capable of passing signals of a high frequency band without being attenuated over a wide frequency band, and a high-frequency switch using the diplexer are provided. The diplexer includes a low-pass filter 82 having a parallel resonant circuit formed by a first capacitor C1 and a first inductor L1 and a serial resonant circuit formed by a second capacitor C2 and a second inductor L2. With this structure, two attenuation poles are provided in the low-pass filter 82. Thus, a passband of a high-pass filter 83 can be widened.

28 Claims, 18 Drawing Sheets

F I G. 4
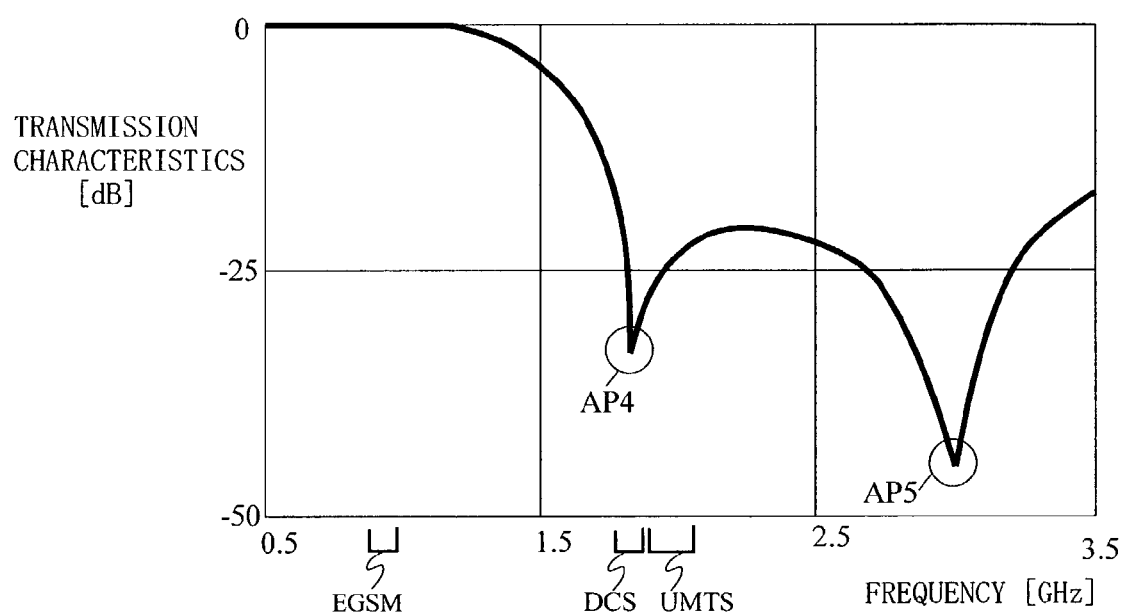

DIPLEXER, AND HIGH-FREQUENCY SWITCH AND ANTENNA DUPLEXER USING THE SAME

BACKGROUND OF THE INVENTION

1. Field of the Invention

The present invention relates to diplexers for use in mobile phones, and high-frequency switches and antenna duplexers using the diplexers. More specifically, the present invention relates to a diplexer for a wireless communications device, such as a mobile phone, capable of using a plurality of communications schemes of different frequency bands, and a high-frequency switch and an antenna duplexer using the diplexer.

2. Description of the Background Art

Mobile phone systems use various schemes, such as EGSM, DCS, UMTS, and PCS schemes. The EGSM (Enhanced-Global System for Mobile Communication) scheme is available mainly in Europe. The DCS (Digital Cellular System) scheme using a 1.8 GHz frequency band has become widely available with the expansion of users. The UMTS (Universal Mobile Telecommunications System) scheme has the potential to achieve next-generation high speed communications. The PCS (Personal Communications Services) system using a 1.9 GHz frequency band is available mainly in the United States.

FIG. 19 is an illustration of frequency bands used in the EGSM, DCS, and UMTS schemes. In FIG. 19, bands denoted by "Tx" in parentheses under schemes are frequency bands for use in transmission, and bands denoted by "Rx" in parentheses under schemes are frequency bands for use in reception. As illustrated in FIG. 19, the EGSM scheme uses 880 to 960 MHz, the DCS scheme uses 1710 to 1880 MHz, and the UMTS scheme uses 1920 to 2170 MHz. As evident from FIG. 19, the mobile phone systems can be broadly divided into systems using the low frequency band, such as the EGSM scheme, and systems using a high frequency band, such as the DCS and UMTS schemes.

In recent years, with the expansion of users of mobile communications devices such as mobile phones and the globalization of mobile communications systems, it is desired to develop mobile phones capable of using a plurality of schemes as mentioned above, such as using the conventionally-available EGSM scheme of the low frequency band and the recently-available DCS and UMTS schemes of the high frequency band. Such advanced mobile phones should be capable of carrying out multiplex and demultiplex signals in a low-frequency band and signals in a high-frequency band in their internal circuit, because different power amplifiers are required for signals of different frequency bands.

Conventionally, to multiplex and demultiplex signals of the low frequency band and the high frequency band, a device called diplexer has been used. FIG. 20 is a diagram illustrating an equivalent circuit of a conventional diplexer (for example, refer to Japanese Patent Laid-Open Publication No. 2000-349581, paragraph [0003], FIG. 6). In FIG. 20, the conventional diplexer includes a low-pass filter (hereinafter, LPF) 10 connected between a first terminal P51 and a second terminal P52, and a high-pass filter (hereinafter, HPF) 20 connected between the first terminal P51 and a third terminal P53.

In the LPF 10, a first inductor L51 and a first capacitor C51 are placed in parallel between the first terminal P51 and the second terminal P52, a second capacitor C52 is placed in series between the second terminal P52 and a ground. The LPF 10 passes signals of the low frequency band in the EGSM scheme, for example.

In the HPF 20, a third capacitor C53 and a fourth capacitor C54 are placed in series between the first terminal P51 and the third terminal P53. A second inductor L52 and a fifth capacitor C55 are placed in series between a point of connection of the third capacitor C53 and the fourth capacitor C54 and the ground. The HPF 20 passes signals of the high frequency band in the DCS or UMTS scheme, for example.

In the LPF 10, the first inductor L51 and the first capacitor C51 form a parallel resonant circuit, which has a predetermined constant so as to resonate with signals of the high frequency band in the vicinity of a passband of the HPF 20. When the parallel resonant circuit resonates, its impedance is significantly increased, thereby preventing the LPF 10 from passing signals of the high frequency band. That is, the LPF 10 provides an attenuation pole in the high-frequency band. Here, the attenuation pole is a position where a specific frequency is greatly attenuated in an attenuation band of a filter.

FIG. 21 is a graph illustrating transmission characteristics of the LPF 10. A dotted curve indicates transmission characteristics of the LPF 10 on the scale of a right vertical axis in the graph. As illustrated in FIG. 20, the LPF 10 provides an attenuation pole AP50 in the frequency band of the UMTS scheme, and passes signals best in the frequency band of the EGSM scheme.

In the HPF 20, the second inductor L52 and the fifth capacitor C55 form a serial resonant circuit, which has a predetermined constant so as to resonate with signals in the frequency band of the EGSM scheme (frequencies corresponding to the vicinity of a passband of the LPF 10). When the serial resonant circuit resonates, its impedance is significantly decreased to effectively become zero. The impedance from the first terminal P51 to the third terminal P53 is significantly increased compared with the LPF 10, leading to the HPF 20 being prevented from passing signals of frequencies corresponding to the EGSM scheme. That is, the HPF 20 provides an attenuation pole in the vicinity of the frequency band of the EGSM scheme.

FIG. 22 is a graph illustrating transmission characteristics of the HPF 20. A dotted curve indicates transmission characteristics of the HPF 20 on the scale of a right vertical axis in the graph. As illustrated in FIG. 22, the HPF 20 provides an attenuation pole AP51 in the frequency band of the EGSM scheme, and passes signals best in the frequency band of the UMTS scheme.

In the above-described conventional diplexer, a signal in the frequency band of the EGSM scheme supplied to the first terminal P51 is almost completely prevented from passing through the HPF 20, but is able to pass through the LPF 10 almost completely. Therefore, such a signal is transmitted not to the HPF 20 side but to the LPF 10 side, and is extractable from the second terminal P52. On the other hand, a signal of the high frequency band supplied to the first terminal P51 is almost completely prevented from passing through the LPF 10, but is able to pass through the HPF 20 almost completely. Therefore, such a signal is transmitted not to the LPF 10 side but to the HPF 20 side, and is extractable from the third terminal P53. As such, with the use of the conventional diplexer, low-frequency signals and high-frequency signals can be multiplexed and demultiplexed.

As illustrated in FIG. 21, in the LPF 10, the signal in the frequency band of the UMTS scheme is sufficiently attenuated and therefore cannot pass through the LPF 10. In contrast, the signal in the frequency band of the DCS scheme is not sufficiently attenuated and therefore part of the signal can pass through the LPF 10. Consequently, as illustrated in FIG. 22, the part of the signal in the frequency band of the DCS scheme passing through the LPF 10 is attenuated to pass through the HPF 20. This poses a problem for a mobile phone supporting both the DCS scheme and the UMTS scheme.

As such, in the above-described diplexer, the LPF 10 placed between the first terminal P51 and the second terminal P2 provides the attenuation pole 50 in the vicinity of the passband of the HPF 20 by using a single parallel resonant circuit. This makes it difficult to ensure attenuation over a wide frequency band. As a result, in the conventional diplexer, the transmission characteristics of the HPF 20 become narrow, making it difficult for signals of the high frequency band to be used in a plurality of mobile phone systems to pass without being attenuated over a wide frequency band.

SUMMARY OF THE INVENTION

Therefore, an object of the present invention is to provide a diplexer capable of passing signals of a high frequency band without being attenuated over a wide frequency band.

Another object of the present invention is to provide a high-frequency switch using a diplexer capable of passing signals of the high frequency band without being attenuated over a wide frequency band.

Still another object of the present invention is to provide an antenna duplexer using a diplexer capable of passing signals of the high frequency band without being attenuated over a wide frequency band.

The present invention has the following features to attain the objects mentioned above.

According to a first aspect of the present invention, a diplexer for multiplexing and demultiplexing radio waves of different frequency bands includes:

a low-pass filter placed between a first terminal connected to an antenna side and a second terminal for transmitting and receiving a signal of a low frequency band, the low-pass filter passing only the signal of the low frequency band; and a high-pass filter placed between the first terminal and a third terminal for transmitting and receiving a signal of a high frequency band, the high-pass filter passing only the signal of the high frequency band, wherein the low-pass filter includes at least two resonant circuits to provide at least two attenuation poles at a high-frequency side of a passband.

In the first aspect, two resonant circuits included in the low-pass filter provide two attenuation poles in the high frequency side of the passband. Therefore, the low-pass filter can sufficiently attenuate signals of the high frequency band over a wide frequency band. Thus, a diplexer capable of passing signals of the high frequency band without being attenuated over a wide frequency band in the high-pass filter can be provided.

According to a second aspect based on the first aspect, the high-pass filter further includes a single resonant circuit, and the high-pass filter provides an attenuation pole at a low-frequency side of a passband, whereby the low-pass filter passes only a signal of a frequency band that is lowest of the different frequency bands.

In the second aspect, a signal resonant circuit included in the high-pass filter provides a single attenuation pole in the low frequency side of the passband. Therefore, attenuation of signals of the low frequency band can be suppressed, and the low-pass filter can pass only the signals of the lowest frequency band. Thus, it is possible to multiplex and demultiplex signals in the frequency band of the EGSM scheme and signals in the high frequency band of the DCS scheme, the UMTS scheme, the PCS scheme, etc, for example.

According to a third aspect based on the second aspect, the low-pass filter includes, as the two resonant circuits:

a parallel resonant circuit formed by a first inductor and a first capacitor that are placed between the first terminal and the second terminal; and a serial resonant circuit formed by a second inductor and a second capacitor that are placed between the second terminal and a ground.

In the third aspect, a single attenuation pole is provided when the parallel resonant circuit of the low-pass filter resonates, and also a single attenuation pole is provided when the serial resonant circuit of the low-pass filter resonates. Thus, a sufficient amount of attenuation can be ensured over a wide frequency band. Thus, it is possible to provide a diplexer capable of passing signals of the high frequency band without being attenuated over a wide frequency band.

Also, with the structure of the diplexer according to the third aspect, a diplexer capable of achieving wide-band pass characteristics with the minimum circuitry can be provided.

According to a fourth aspect based on the third aspect, the high-pass filter further includes a serial circuit formed by a third capacitor and a fourth capacitor that are placed between the first terminal and the third terminal, and the high-pass filter includes, as the resonant circuit, a serial resonant circuit formed by a third inductor and a fifth capacitor that are placed between a point of connection of the third capacitor and the fourth capacitor, and the ground.

In the fourth aspect, a single attenuation pole is provided when the serial resonant circuit of the high-pass filter resonates. Therefore, attenuation of signals of the low frequency band can be suppressed.

According to a fifth aspect based on the fourth aspect, the low-pass filter and the high-pass filter are formed by a lamination body obtained by laminating a plurality of dielectric layers including a plurality of strip line electrodes for implementing the first through third inductors, a plurality of capacitor electrodes for implementing the first through fifth capacitors, and a plurality of conductive via holes for connecting the strip line electrodes and the capacitor electrodes.

In the fifth aspect, the low-pass filter and the high-pass filter are incorporated in a single lamination body. Therefore, it is possible to reduce the diplexer in size and height.

According to a sixth aspect based on the fifth aspect, at least one dielectric layer includes a ground electrode, and at least one strip line electrode for implementing the first inductor is placed on a dielectric layer that is upper in a lamination direction than a dielectric layer having the ground electrode placed thereon and is equal to or upper in the lamination direction than a dielectric layer having at least one of the strip line electrodes placed thereon and a dielectric layer having at least one of the strip line electrodes for implementing the third inductor placed thereon.

In the sixth aspect, the first inductor through which a signal directly passes is placed on a layer that is upper than a layer having a ground electrode and that is equal to or upper than a layer having other strip line electrode. With this structure, stray capacitance occurring between the first inductor and other electrode patterns such as the ground electrode or the capacitor electrode can be reduced, thereby reducing changes in characteristics of the inductor. Consequently, a diplexer having circuitry as designed can be provided.

According to a seventh aspect based on the fifth aspect, at least one dielectric layer includes a ground electrode, at least one strip line electrode for implementing the first capacitor in the parallel resonant circuit of the low-pass filter is placed on a dielectric layer that is upper in a lamination direction than a dielectric layer having the ground electrode placed thereon, and at least one strip line electrode for implementing the first inductor in the parallel resonant circuit of the low-pass filter is placed on a dielectric layer upper in the lamination direction than a dielectric layer having the capacitor electrode.

In the seventh aspect, the capacitor electrode implementing the first capacitor is placed between the ground electrode and the strip line electrode implementing the first inductor. With this structure, stray capacitance occurring between the first inductor and the ground electrode can be reduced. Consequently, a diplexer having circuitry as designed can be provided.

According to an eighth aspect based on the fifth aspect, at least one dielectric layer includes a ground electrode, at least one capacitor electrode for implementing the second capacitor in the serial resonant circuit of the low-pass filter is placed on a dielectric layer upper in a lamination direction than a dielectric layer having the ground electrode placed thereon, and at least one strip line electrode for implementing the second inductor in the serial resonant circuit of the low-pass filter is placed on a dielectric layer upper in the lamination direction than a dielectric layer having the capacitor electrode.

In the eighth aspect, the capacitor electrode implementing the second capacitor is placed between the ground electrode and the strip line electrode implementing the second inductor. With this structure, stray capacitance occurring between the second inductor and the ground electrode can be reduced. Consequently, a diplexer having circuitry as designed can be provided.

According to a ninth aspect based on the fifth aspect, at least one dielectric layer includes a ground electrode, at least one capacitor electrode for implementing the fifth capacitor in the serial resonant circuit of the high-pass filter is placed on a dielectric layer upper in a lamination direction than a dielectric layer having the ground electrode placed thereon, and at least one strip line electrode for implementing the third inductor in the serial resonant circuit of the high-pass filter is placed on a dielectric layer upper in the lamination direction than a dielectric layer having the capacitor electrode placed thereon.

In the ninth aspect, the capacitor electrode implementing the fifth capacitor is placed between the ground electrode and the strip line electrode implementing the third inductor. With this structure, stray capacitance occurring between the third inductor and the ground electrode can be reduced. Consequently, a diplexer having circuitry as designed can be provided.

According to a tenth aspect of the present invention, a high-frequency switch for switching transmission and reception of radio waves of different frequency bands includes:

a diplexer for transmitting and receiving the radio waves of the different frequency bands via a first terminal connected to an antenna side for multiplexing and demultiplexing the radio waves;

a low-frequency transmission and reception switching circuit connected to a second terminal included in the diplexer for transmitting and receiving a signal of a low frequency band; and a high-frequency transmission and reception switching circuit connected to a third terminal included in the diplexer for transmitting and receiving a signal of a high frequency band, the diplexer including:
a low-pass filter placed between the first terminal and the second terminal for passing only the signal of the low frequency band; and
a high-pass filter placed between the first terminal and the third terminal for passing only the signal of the high frequency band, and
the low-pass filter having at least two resonant circuits to provide at least two attenuation poles at a high-frequency side of a passband.

In the tenth aspect, two resonant circuits included in the low-pass filter of the diplexer provide two attenuation poles in the high frequency side of the passband. Therefore, the low-pass filter can sufficiently attenuate signals of the high frequency band over a wide frequency band. Thus, a high-frequency switch capable of passing signals of the high frequency band without being attenuated over a wide frequency band in the high-pass filter can be provided.

According to an eleventh aspect based on the tenth aspect,
the high-pass filter includes a single resonant circuit,
the high-pass filter provides a single attenuation pole, and
the low-pass filter passes only a signal of lowest frequencies.

In the eleventh aspect, a signal resonant circuit included in the high-pass filter provides a single attenuation pole in the low frequency side of the passband. Therefore, attenuation of signals of the low frequency band can be suppressed, and the low-pass filter can pass only the signals in the lowest frequencies. Thus, it is possible to provide a high-frequency switch capable of multiplexing and demultiplexing signals in the frequency band of the EGSM scheme and signals in the frequency band of the DCS scheme, the UMTS scheme, the PCS scheme, etc, for example.

According to a twelfth aspect based on the eleventh aspect,
the low-pass filter includes, as the two resonant circuits:
a parallel resonant circuit formed by a first inductor and a first capacitor that are placed between the first terminal and the second terminal; and
a serial resonant circuit formed by a second inductor and a second capacitor that are placed between the second terminal and a ground.

In the twelfth aspect, a single attenuation pole is provided when the parallel resonant circuit of the low-pass filter resonates, and also a single attenuation pole is provided when the serial resonant circuit of the low-pass filter resonates. Thus, a sufficient amount of attenuation can be ensured over a wide frequency band. Thus, it is possible to provide a high-frequency switch capable of passing signals of the high frequency band without being attenuated over a wide frequency band.

Also, with the structure of the high-frequency switch according to the twelfth aspect, a high-frequency switch capable of achieving wide-band pass characteristics with the minimum circuitry can be provided.

According to a thirteenth aspect based on the twelfth aspect, the high-pass filter further includes a serial circuit formed by a third capacitor and a fourth capacitor that are placed between the first terminal and the third terminal, and the high-pass filter includes, as the resonant circuit, a serial resonant circuit formed by a third inductor and a fifth capacitor that are placed between a point of connection of the third capacitor and the fourth capacitor and the ground.

In the thirteenth aspect, a single attenuation pole is provided when the serial resonant circuit of the high-pass filter resonates. Therefore, a high-frequency switch capable of suppressing attenuation of signals of the low frequency band can be provided.

According to a fourteenth aspect based on the thirteenth aspect, the high-frequency switch is formed by a lamination body obtained by laminating a plurality of dielectric layers including a plurality of strip line electrodes for implementing the inductors, a plurality of capacitor electrodes for implementing the capacitors, and a plurality of conductive via holes for connecting the strip line electrodes and the capacitor electrodes.

In the fourteenth aspect, the inductors and the capacitors forming the high-frequency switch are incorporated in a single lamination body. Therefore, it is possible to reduce the high-frequency switch in size and height.

According to a fifteenth aspect based on the fourteenth aspect, the lamination body includes the plurality of strip line electrodes for implementing the first through third inductors, the plurality of capacitor electrodes for implementing the first through fifth capacitors, and the plurality of conductive via holes for connecting the strip line electrodes and the capacitor electrodes to implement the low-pass filter and the high-pass filter.

In the fifteenth aspect, the low-pass filter and the high-pass filter of the diplexer are incorporated in a single lamination body forming the high-frequency switch. Therefore, it is possible to reduce the high-frequency switch in size and height.

According to a sixteenth aspect based on the fifteenth aspect, at least one of the dielectric layers includes a ground electrode, and at least one of the strip line electrodes for implementing the first inductor is placed on a dielectric layer that is upper in a lamination direction than a dielectric layer having the ground electrode placed thereon and is equal to or upper in the lamination direction than a dielectric layer having at least one of the strip line electrodes placed thereon and a dielectric layer having at least one of the strip line electrodes for implementing the third inductor placed thereon.

In the sixteenth aspect, the first inductor through which a signal directly passes is placed on a layer that is upper than a layer having a ground electrode and that is equal to or upper than a layer having other strip line electrode. With this structure, stray capacitance occurring between the first inductor and other electrode patterns such as the ground electrode or the capacitor electrode can be reduced, thereby reducing changes in characteristics of the inductor. Consequently, a high-frequency switch having circuitry as designed can be provided.

According to a seventeenth aspect based on the fifteenth aspect, at least one of the dielectric layers includes a ground electrode, at least one of the strip line electrodes for implementing the first capacitor in the parallel resonant circuit of the low-pass filter is placed on a dielectric layer that is upper in a lamination direction than a dielectric layer having the ground electrode placed thereon, and at least one of the strip line electrodes for implementing the first inductor in the parallel resonant circuit of the low-pass filter is placed on a dielectric layer upper in the lamination direction than a dielectric layer having the capacitor electrode.

In the seventeenth aspect, the capacitor electrode implementing the first capacitor is placed between the ground electrode and the strip line electrode implementing the first inductor. With this structure, stray capacitance occurring between the first inductor and the ground electrode can be reduced. Consequently, a high-frequency switch having circuitry as designed can be provided.

According to an eighteenth aspect based on the fifteenth aspect, at least one of the dielectric layers includes a ground electrode, at least one of the capacitor electrodes for implementing the second capacitor in the serial resonant circuit of the low-pass filter is placed on a dielectric layer upper in a lamination direction than a dielectric layer having the ground electrode placed thereon, and at least one of the strip line electrodes for implementing the second inductor in the serial resonant circuit of the low-pass filter is placed on a dielectric layer upper in the lamination direction than a dielectric layer having the capacitor electrode.

In the eighteenth aspect, the capacitor electrode implementing the second capacitor is placed between the ground electrode and the strip line electrode implementing the second inductor. With this structure, stray capacitance occurring between the second inductor and the ground electrode can be reduced. Consequently, a high-frequency switch having circuitry as designed can be provided.

According to a nineteenth aspect based on the fifteenth aspect, at least one of the dielectric layers includes a ground electrode, at least one of the capacitor electrodes for implementing the fifth capacitor in the serial resonant circuit of the high-pass filter is placed on a dielectric layer upper in a lamination direction than a dielectric layer having the ground electrode placed thereon, and at least one of the strip line electrodes for implementing the third inductor in the serial resonant circuit of the high-pass filter is placed on a dielectric layer upper in the lamination direction than a dielectric layer having the capacitor electrode placed thereon.

In the nineteenth aspect, the capacitor electrode implementing the fifth capacitor is placed between the ground electrode and the strip line electrode implementing the third inductor. With this structure, stray capacitance occurring between the third inductor and the ground electrode can be reduced. Consequently, a high-frequency switch having circuitry as designed can be provided.

According to a twentieth aspect based on the fourteenth aspect, at least one of the low-frequency transmission and reception switching circuit and the high-frequency transmission and reception switching circuit is a circuit for switching transmission and reception based on a voltage applied to diodes, and the diodes are placed on a top surface of the lamination body.

In the twentieth aspect, the high-frequency switch can be reduced in size and height.

According to a twenty-first aspect based on the fourteenth aspect, at least one of the low-frequency transmission and reception switching circuit and the high-frequency transmission and reception switching circuit is a GaAs switch, and the GaAs switch is placed on a top surface of the lamination body.

In the twenty-first aspect, the high-frequency switch can be reduced in size and height.

According to a twenty-second aspect of the present invention, an antenna duplexer for simultaneously carrying out transmission and reception of radio waves of different frequency bands includes:

a diplexer for transmitting and receiving the radio waves of the different frequency bands via a first terminal connected to an antenna side for multiplexing and demultiplexing the radio waves;

a first duplexer connected to a second terminal included in the diplexer for transmitting and receiving a signal of a low frequency band; and a second duplexer connected to a third terminal included in the diplexer for transmitting and receiving a signal of a high frequency band;

the diplexer including:
a low-pass filter placed between the first terminal and the second terminal for passing only the signal of the low frequency band; and
a high-pass filter placed between the first terminal and the third terminal for passing only the signal of the high frequency band, and the low pass filter having at least two resonant circuits to provide at least two attenuation poles at a high-frequency side of a passband.

In the twenty-second aspect, two resonant circuits included in the low-pass filter of the diplexer provide two attenuation poles in the high frequency side of the passband. Therefore, the low-pass filter can sufficiently attenuate signals of the high frequency band over a wide frequency band. Thus, an antenna duplexer capable of passing signals of the high frequency band without being attenuated over a wide frequency band in the high-pass filter can be provided.

According to a twenty-third aspect based on the twenty-second aspect, the high-pass filter includes a single resonant circuit,
the high-pass filter provides a single attenuation pole, and
the low-pass filter passes only a signal of lowest frequencies.

In the twenty-third aspect, a signal resonant circuit included in the high-pass filter provides a single attenuation pole in the low frequency side of the passband. Therefore, attenuation of signals of the low frequency band can be suppressed, and the low-pass filter can pass only the signals of the lowest frequency band. Thus, it is possible to provide an antenna duplexer capable of multiplexing and demultiplexing signals in the frequency band of the IS-95 scheme and signals in the high frequency band of the PCS scheme, for example.

According to the twenty-fourth aspect based on the twenty-third aspect, the low-pass filter includes, as the two resonant circuits:
a parallel resonant circuit formed by a first inductor and a first capacitor that are placed between the first terminal and the second terminal; and a serial resonant circuit formed by a second inductor and a second capacitor that are placed between the second terminal and a ground.

According to the twenty-fifth aspect based on the twenty-fourth aspect, the high-pass filter further includes a serial circuit formed by a third capacitor and a fourth capacitor that are placed between the first terminal and the third terminal, and the high-pass filter includes, as the resonant circuit, a serial resonant circuit formed by a third inductor and a fifth capacitor that are placed between a point of connection of the third capacitor and the fourth capacitor and the ground.

According to the twenty-sixth aspect based on the twenty-fifth aspect, the high-frequency switch is formed by a lamination body obtained by laminating a plurality of dielectric layers including a plurality of strip line electrodes for implementing the inductors, a plurality of capacitor electrodes for implementing the capacitors, and a plurality of conductive via holes for connecting the strip line electrodes and the capacitor electrodes.

According to a twenty-seventh aspect of the present invention, a wireless communications device for carrying out transmission and reception of radio waves of different frequency bands includes a high-frequency switch for switching the transmission and reception of the radio waves of the different frequency bands, the high-frequency switch including:
a diplexer for transmitting and receiving the radio waves of the different frequency bands via a first terminal connected to an antenna side for multiplexing and demultiplexing the radio waves;

a low-frequency transmission and reception switching circuit connected to a second terminal included in the diplexer for transmitting and receiving a signal of a low frequency band; and a high-frequency transmission and reception switching circuit connected to a third terminal included in the diplexer for transmitting and receiving a signal of a high frequency band, the diplexer including:
a low-pass filter placed between the first terminal and the second terminal for passing only the signal of the low frequency band; and
a high-pass filter placed between the first terminal and the third terminal for passing only the signal of the high frequency band, and the low-pass filter having at least two resonant circuits to provide at least two attenuation poles at a high-frequency side of a passband.

In the twenty-seventh aspect, with the high-frequency switch using the diplexer capable of passing signals of the high frequency band without being attenuated over a wide frequency band, it is possible to provide a wireless communications device capable of transmitting and receiving radio waves in a plurality of high-frequency bands.

According to a twenty-eighth aspect of the present invention, a wireless communications device for carrying out transmission and reception of radio waves of different frequency bands includes an antenna duplexer for simultaneously carrying out transmission and reception of radio waves of different frequency bands, the antenna duplexer including:

a diplexer for transmitting and receiving the radio waves of the different frequency bands via a first terminal connected to an antenna side for multiplexing and demultiplexing the radio waves;

a first duplexer connected to a second terminal included in the diplexer for transmitting and receiving a signal of a low frequency band; and a second duplexer connected to a third terminal included in the diplexer for transmitting and receiving a signal of a high frequency band, the diplexer including:

a low-pass filter placed between the first terminal and the second terminal for passing only the signal of the low frequency band; and a high-pass filter placed between the first terminal and the third terminal for passing only the signal of the high frequency band, and the low pass filter having at least two resonant circuits to provide at least two attenuation poles at a high-frequency side of a passband.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a graph illustrating an example where an attenuation pole of a low-pass filter is provided to a portion other than a frequency band of a signal to be extracted;

DESCRIPTION OF THE PREFERRED EMBODIMENTS (First Embodiment)

Figure 1:
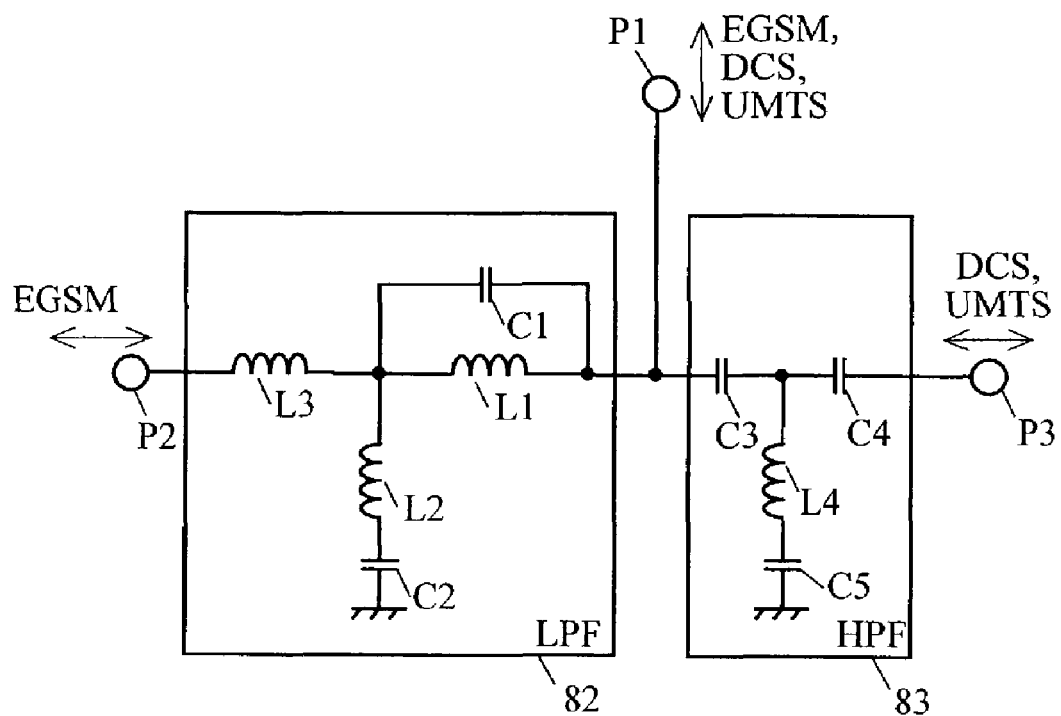
FIG. 1 is a diagram illustrating an equivalent circuit of a diplexer according to a first embodiment of the present invention.

FIG. 1 is a diagram illustrating an equivalent circuit of a diplexer according to a first embodiment of the present invention. The diplexer according to the first embodiment includes a low-pass filter (hereinafter, LPF) 82 placed between a first terminal P1 and a second terminal P2, and a high-pass filter (hereinafter, HPF) 83 placed between the first terminal P1 and a third terminal P3.

In the LPF 82, a first inductor L1 and a first capacitor C1 are placed in parallel between the first terminal P1 and the second terminal P2. A third inductor L3 is connected in series to a parallel circuit formed by the first inductor L1 and the first capacitor C1. A second inductor L2 and a second capacitor C2 are placed in series between a point of connection of the parallel circuit and the third inductor L3 and a ground. The LPF 82 passes signals of a low frequency band.

In the HPF 83, a third capacitor C3 and a fourth capacitor C4 are placed in series between the first terminal P1 and the third terminal P3. A fourth inductor L4 and a fifth inductor C5 are placed in series between a point of connection of the third capacitor C3 and the fourth capacitor C4 and the ground. The HPF 83 passes signals of a high frequency band.

Figure 2:
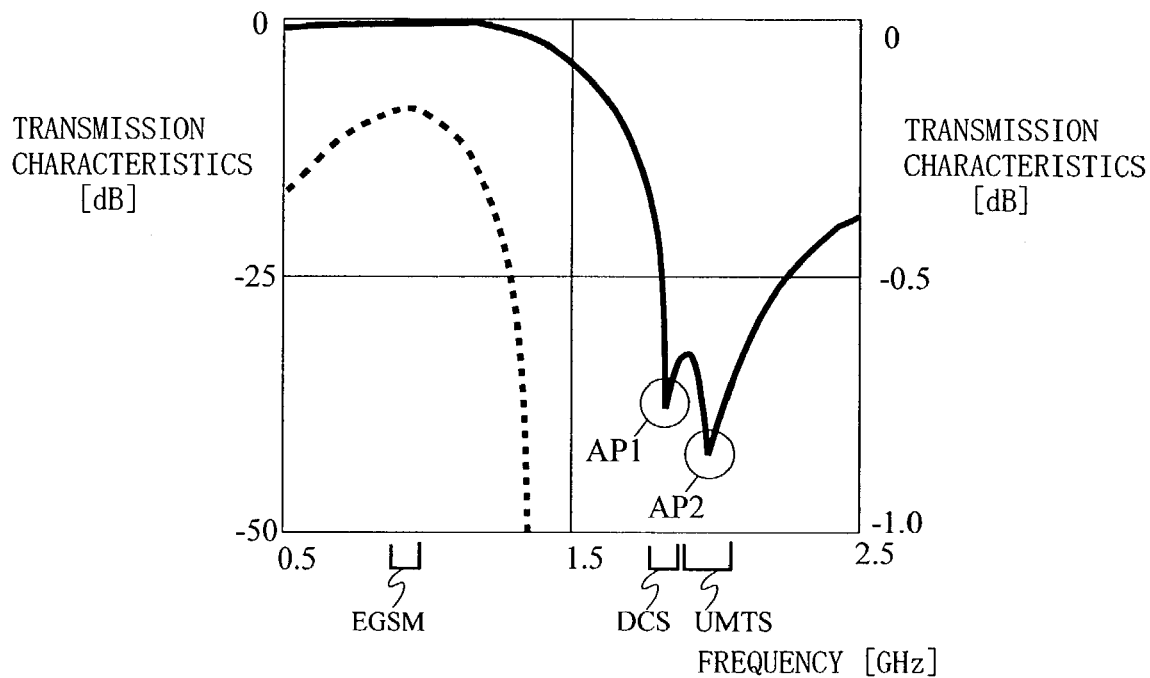
FIG. 2 is a graph illustrating transmission characteristics of an LPF 82 in the diplexer of FIG. 1.

FIG. 2 is a graph illustrating transmission characteristics of the LPF 82 in the diplexer of FIG. 1. With reference to FIG. 2, the function of the LPF 82 is described. In the LPF 82, the parallel resonant circuit formed by the first inductor L1 and the first capacitor C1 has a predetermined constant so as to resonate with signals in the frequency band of the DCS scheme. When the parallel resonant circuit resonates, its impedance is significantly increased. Therefore, the LPF 82 provides an attenuation pole AP1 in the vicinity of the frequency band of the DCS scheme. Thus, the LPF 82 has the transmission characteristics as illustrated in FIG. 2, passing signals in the frequency band of the EGSM scheme but not passing those of the DCS scheme.

In the LPF 82, a serial resonant circuit formed by the second inductor L2 and the second capacitor C2 has a predetermined constant so as to resonate with signals in the frequency band of the UMTS scheme. When this serial circuit resonates, its impedance is significantly decreased enough to become zero. At this time, the impedance from the first terminal P1 to the second terminal P2 is significantly increased. Therefore, the LPF 82 does not pass signals in the frequency band of the UMTS scheme. That is, the LPF 82 provides an attenuation pole AP2 in the vicinity of the frequency band of the UMTS scheme. As a result, the LPF 82 has the transmission characteristics as illustrated in FIG. 2, passing signals in the frequency band of the EGSM scheme but not passing those of the DCS and UMTS schemes. The above-described impedance from the first terminal P1 to the second terminal P2 can be calculated by applying the above resonance conditions. How to calculate the impedance is well known, and therefore is not described herein.

Figure 21:
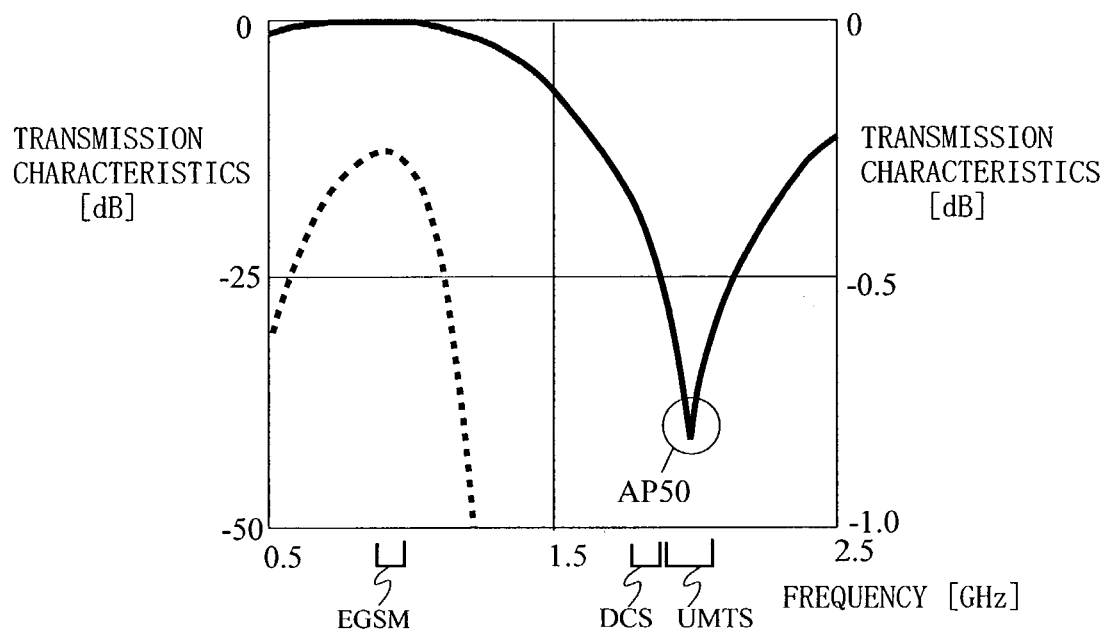
FIG. 21 is a graph illustrating transmission characteristics of an LPF 10.

Note that, in FIG. 2, the transmission characteristics of the frequency band of the EGSM scheme are improved compared with those of the conventional diplexer (refer to FIG. 21), and are also widened in frequency band (refer to a dotted curve in FIG. 2). This is because two attenuation poles are provided at the high frequency side, thereby lifting the transmission characteristics at the low frequency side to the high frequency side.

Figure 3:
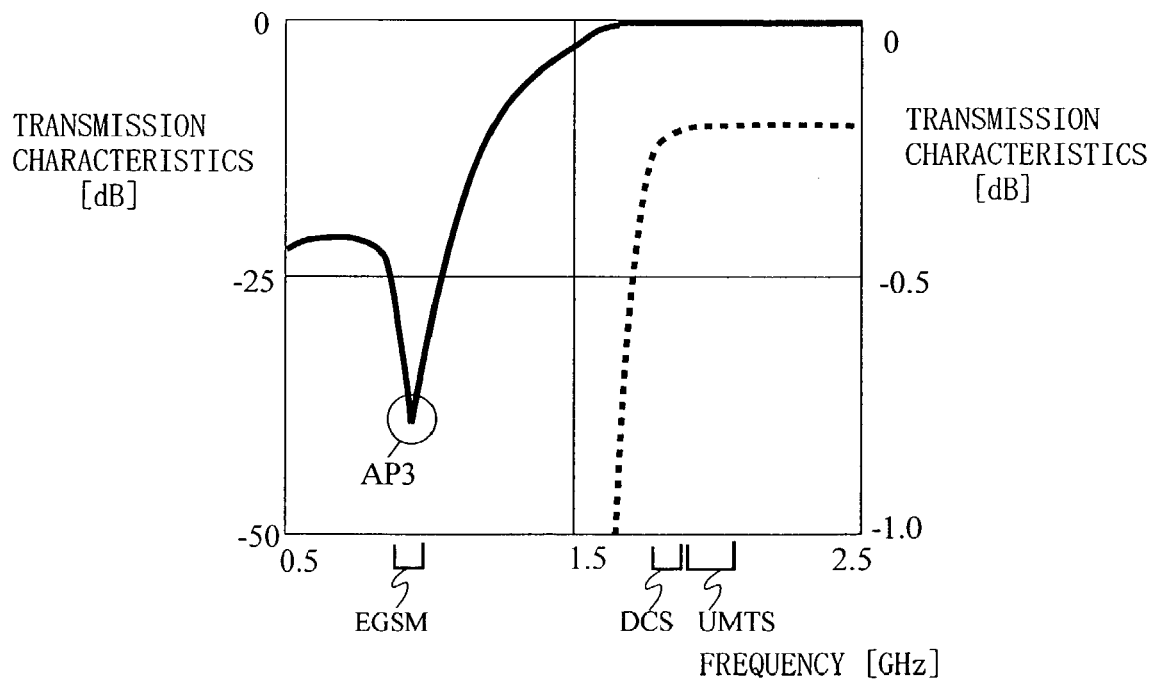
FIG. 3 is a graph illustrating transmission characteristics of an HPF 83 in the diplexer of FIG. 1.

FIG. 3 is a graph illustrating transmission characteristics of the HPF 83 in the diplexer of FIG. 1. With reference to FIG. 3, the function of the HPF 83 is described below. In the HPF 83, the fourth inductor L4 and the fifth capacitor C5 form a serial resonant circuit, which has a predetermined constant so as to resonate with signals in the frequency band of the EGSM scheme. When this serial resonant circuit resonates, its impedance becomes closer to zero. When the first terminal P1 is supplied with a signal in the frequency band of the EGSM scheme, the impedance of the HPF 83 from the first terminal P1 to the third terminal P3 is significantly increased. This can be proven by calculating the impedance from the first terminal P1 to the third terminal P3 and applying the resonance conditions to the calculated result. How to calculate the impedance is well known, and therefore is not described herein. That is, the HPF 83 provides an attenuation pole AP3 in the vicinity of the frequency band of the EGSM scheme. As a result, as illustrated in FIG. 3, the HPF 83 passes signals in the frequency band of the DCS and UMTS schemes, but does not pass those of the EGSM scheme.

Figure 22:
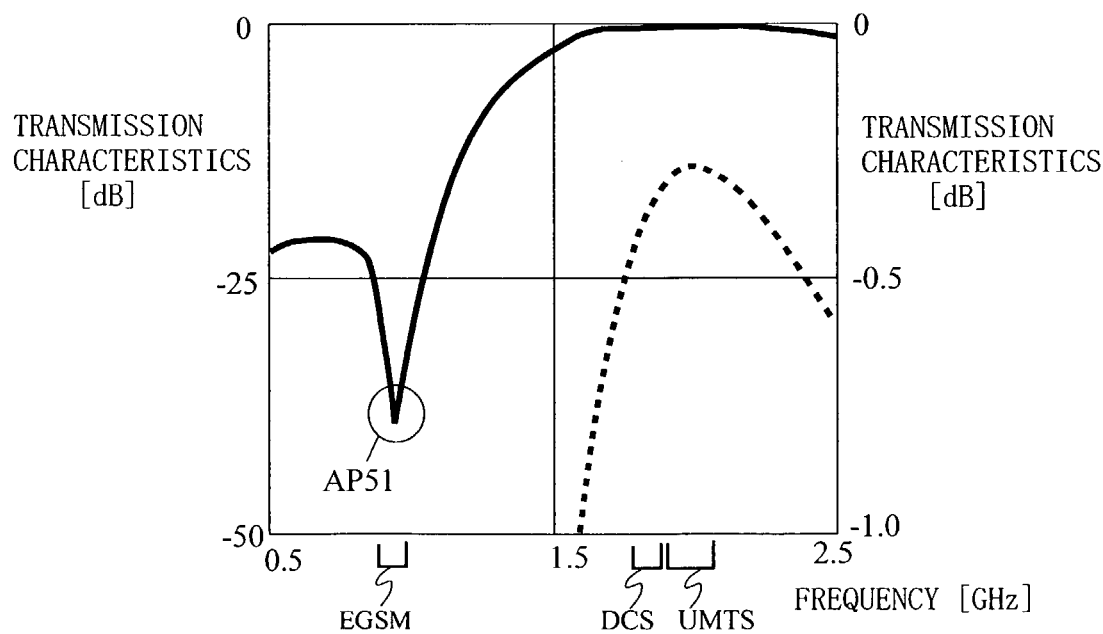
FIG. 22 is an illustration showing transmission characteristics of an HPF 20.

What is to be noted here is the transmission characteristics of the HPF 83 in the frequency band of the DCS and UMTS schemes, as denoted by a dotted curve in FIG. 3. The transmission characteristics of the HPF 83 in the frequency bands of the DCS and UMTS schemes are widened compared with the conventional HPF (refer to the dotted curve in FIG. 22). That is, as evident from the dotted curve in FIG. 3, the HPF 83 can have good transmission characteristics even in the frequency band of the DCS scheme. This is because, with the two attenuation poles AP1 and AP2 provided by the LPF 82 in the vicinity of the passband of the HPF 83, signals in the vicinity of the passband of the HPF 83 can be supplied almost entirely to the HPF 83 side almost without passing through the LPF 82. Therefore, more signals in the frequency band of the DCS and UMTS schemes are supplied to the HPF 83 than those to the conventional HPF. Therefore, the HPF 83 can obtain better transmission characteristics over a wide frequency band.

The operation of the diplexer according to the first embodiment is described below.

When a signal in the frequency band of the EGSM scheme is supplied to the first terminal P1, the serial resonant circuit of the HPF 83 enters a resonant state. Therefore, the impedance from the first terminal P1 to the third terminal P3 is significantly increased. Consequently, the signal in the frequency band of the EGSM scheme supplied to the first terminal P1 is transmitted to the LPF 82 side whose impedance is significantly lower than that of the HPF 83, and is extractable from the second terminal P2.

When a signal in the frequency band of the DCS scheme is supplied to the first terminal P1, the parallel resonant circuit formed by the first capacitor C1 and the first inductor L1 of the LPF 82 enters a resonant state, leading to an extreme increase in its impedance. Consequently, the impedance from the first terminal P1 to the second terminal P2 is significantly increased. Therefore, the signal in the frequency band of the DCS scheme supplied to the first terminal P1 is not transmitted to the LPF 82 side, but to the HPF 83 side whose impedance is significantly lower than that of the LPF 82. Therefore, the signal is extractable from the third terminal P3.

When a signal in the frequency band of the UMTS scheme is supplied to the first terminal P1, the serial resonant circuit formed by the second capacitor C2 and the second inductor L2 of the LPF 82 enters a resonant state. Therefore, the impedance of the serial resonant circuit becomes closer to zero, and the impedance of the parallel resonant circuit formed by the first capacitor C1 and the first inductor L1 becomes increased. Consequently, the impedance from the first terminal P1 to the second terminal P2 is significantly increased. Therefore, the signal in the frequency band of the UMTS scheme is transmitted not to the LPF 82 side, but to the HPF 83 side whose impedance is significantly low compared with that of the LPF82, and is extractable from the third terminal P3.

When a transmission signal of the EGSM scheme is supplied to the second terminal P2, the serial resonant circuit of the HPF 83 enters a resonant state. Consequently, the impedance from the second terminal P2 to the third terminal P3 is significantly increased. Therefore, the transmission signal is transmitted from the second terminal P2 to the first terminal P1.

When a transmission signal of the DCS scheme is supplied to the third terminal P3, the parallel resonant circuit of the LPF 82 enters a resonant state. Consequently, the impedance from the third terminal P3 to the second terminal P2 is significantly increased. Therefore, the transmission signal is transmitted from the third terminal P3 to the first terminal P1. When a transmission signal of the UMTS scheme is supplied to the third terminal P3, the serial resonant circuit of the LPF 82 enters a resonant state. Consequently, the impedance from the third terminal P3 to the second terminal P2 is significantly increased. Therefore, the transmission signal is transmitted from the third terminal P3 to the first terminal P1.

As such, according to the diplexer of the first embodiment, the LPF 82 placed between the first terminal P1 and the second terminal P2 provides two attenuation poles AP1 and AP2 in the vicinity of the passband of the HPF 83. Therefore, it is possible to ensure sufficient attenuation over a wide frequency band. Consequently, the HPF 83 placed between the first terminal P1 and the third terminal P3 can have transmission characteristics over a sufficiently wide frequency band compared with transmission characteristics conventionally possessed. With this, it is possible to provide a diplexer capable of passing signals of the high frequency band in the DCS and UMTS schemes, etc., without being attenuated over a wide frequency band.

Furthermore, the LPF 82 is formed by two resonant circuits, a serial resonant circuit and a parallel resonant circuit. Therefore it is possible to provide a diplexer having transmission characteristics over a wide frequency band with minimum circuitry.

Still further, the HPF 83 sufficiently attenuates signals of the passband of the LPF 82 side by a single serial resonant circuit. Therefore, attenuation of signals of the low frequency band can be suppressed.

Still further, the third inductor L3 included in the LPF 82 according to the first embodiment is required merely for constructing a high-frequency switch using the diplexer according to the first embodiment. Theoretically, the third inductor L3 is not required for constructing the diplexer itself.

In the first embodiment, the LPF 82 is exemplarily structured so that the first inductor L1 and the first capacitor C1 form the parallel resonant circuit to provide the attenuation pole AP1 and that the second inductor L2 and the second capacitor C2 form the serial resonant circuit to provide the attenuation pole AP2. Alternatively, the second inductor L2 and the second capacitor C2 may form a serial resonant circuit to provide the attenuation pole AP1, and the first inductor L1 and the first capacitor C1 may form a parallel resonant circuit to provide the attenuation pole AP2. Also in this case, the same effects as mentioned above can be obtained.

Still further, the two resonant circuits in the LPF 82 according to the first embodiment may be two serial resonant circuits or two parallel resonant circuits. Also in this case, the same effects as mentioned above can be obtained.

In the first embodiment, in the LPF 82 of the diplexer according to the first embodiment, two attenuation poles are provided in the vicinity of the frequency band of the signal to be extracted by the HPF 83. Alternatively, no attenuation pole may be provided in the vicinity of the frequency band of the signal to be extracted as long as the signal is sufficiently attenuated. FIG. 4 is a graph illustrating an example where an attenuation pole of the low-pass filter is provided in a portion other than the frequency band of the signal to be extracted. In FIG. 4, the attenuation pole of the low-pass filter is provided in the vicinity of 3.0 GHz. In this case, the second inductor L2 and the second capacitor C2 in the serial resonant circuit are respectively set to enable the establishment of resonance in the vicinity of 3.0 GHz. As illustrated in FIG. 4, an attenuation pole AP4 is provided in the vicinity of the frequency band of the DCS scheme and an attenuation pole AP5 is provided in the vicinity of 3.0 GHz. This makes it possible to ensure a sufficient amount of attenuation even for a signal in the frequency band of the UMTS scheme. Furthermore, such sufficient amount of attenuation can be ensured over a wide frequency band (approximately 1.7 GHz to approximately 3.3 GHz). Therefore, it is possible to provide a diplexer that passes signals of the high frequency band without being attenuated over a wider frequency band.

Still further, in the first embodiment, two resonant circuits are used. Alternatively, three or more resonant circuits may be used in the low-pass filter to provide three or more attenuation poles, thereby ensuring a sufficient amount of attenuation over a wider frequency band.

Still further, in the first embodiment, an exemplary case where the diplexer is used in a combination of three schemes, that is, the EGSM, DCS, and UMTS schemes, has been described. Similarly, the diplexer may be used for a mobile phone in a combination of other systems, such as the EGSM, DCS, and PCS (Personal Communications Services) schemes, by providing attenuation poles in the frequency bands of the DCS and PCS schemes to the LPF.

Still further, the diplexer can be used for a mobile phone using four or more systems, such as the EGSM, AMPS (Advanced Mobile Phone Service), DCS, and PCS schemes. In this case, attenuation poles may be provided to the LPF so that the amount of attenuation at the high frequency side can be ensured over a wide frequency band.

(Second Embodiment)

Figure 5:
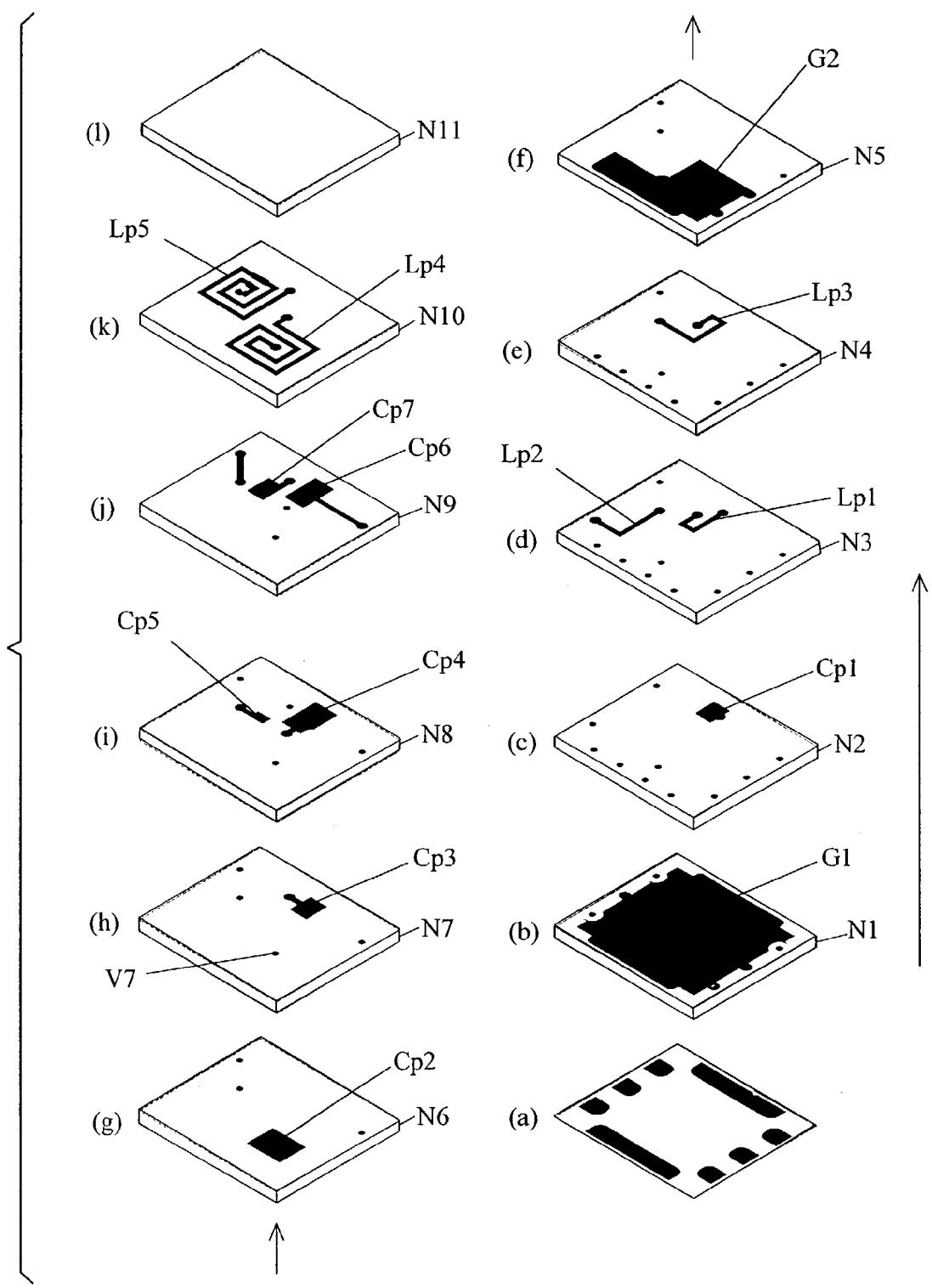
FIG. 5 is an exploded perspective view of a diplexer according to a second embodiment for illustrating the specific structure of the diplexer.

A diplexer according to a second embodiment is achieved by using a lamination body obtained by laminating a plurality of dielectric layers as the equivalent circuit of the diplexer according to the first embodiment. FIG. 1 is also referred to in the second embodiment. FIG. 5 is an exploded perspective view illustrating a specific construction of the diplexer according to the second embodiment. The diplexer according to the second embodiment is constructed by dielectric layers N1 through N11. FIGS. 6, 7, 8, and 9 are enlarged perspective views for describing the respective dielectric layers of the diplexer illustrated in FIG. 5 in more detail. In FIG. 5, reference signs (a) through (l) provided to the dielectric layers respectively correspond to reference signs (a) through (l) in FIGS. 6 through 9. Also, an arrow shown in FIG. 5 indicates a direction in which the dielectric layers are laminated.

Figure 6:
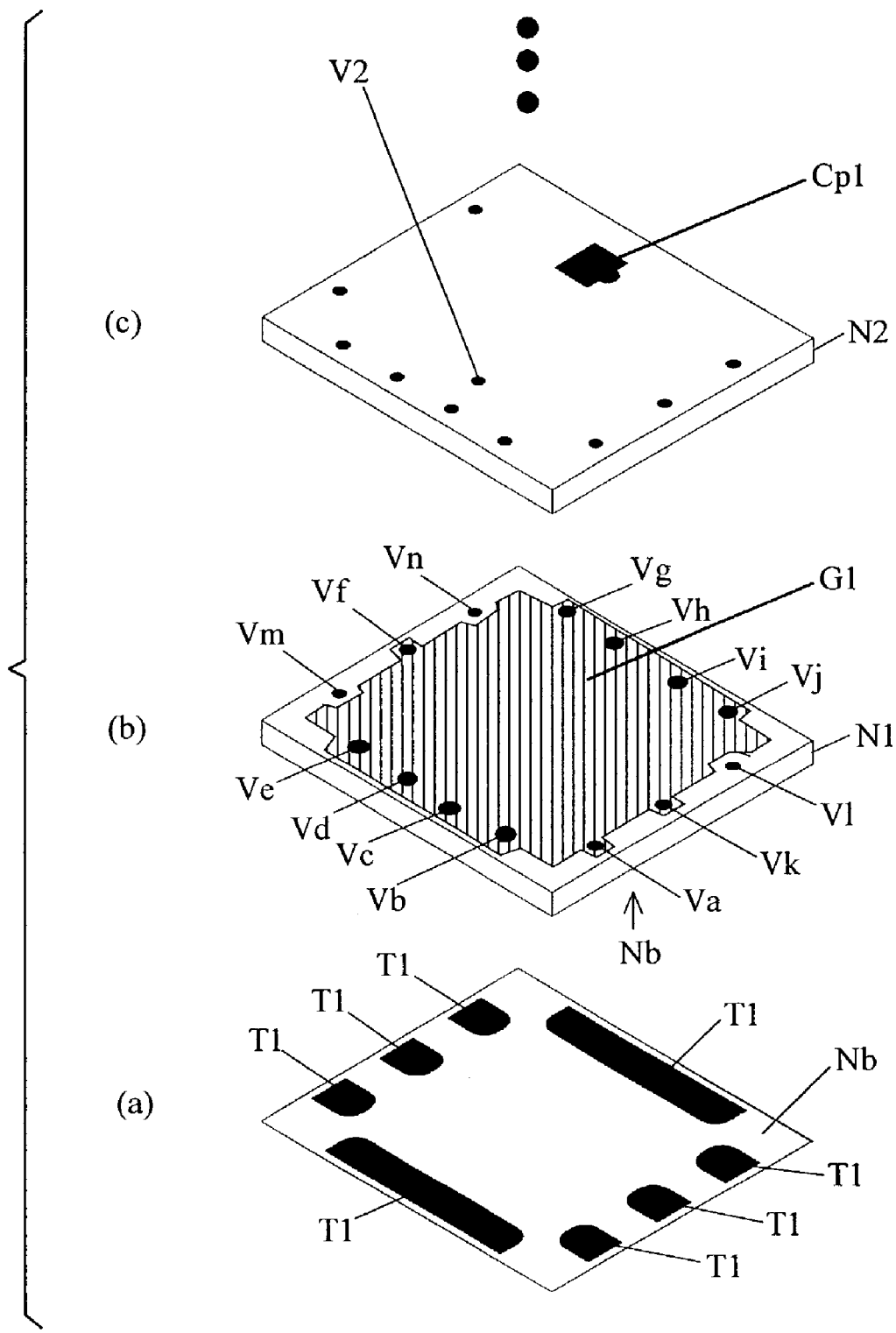
FIG. 6 is an illustration showing dielectric layers N1, N2, and a bottom surface Nb of the dielectric layer N1.
Figure 7:
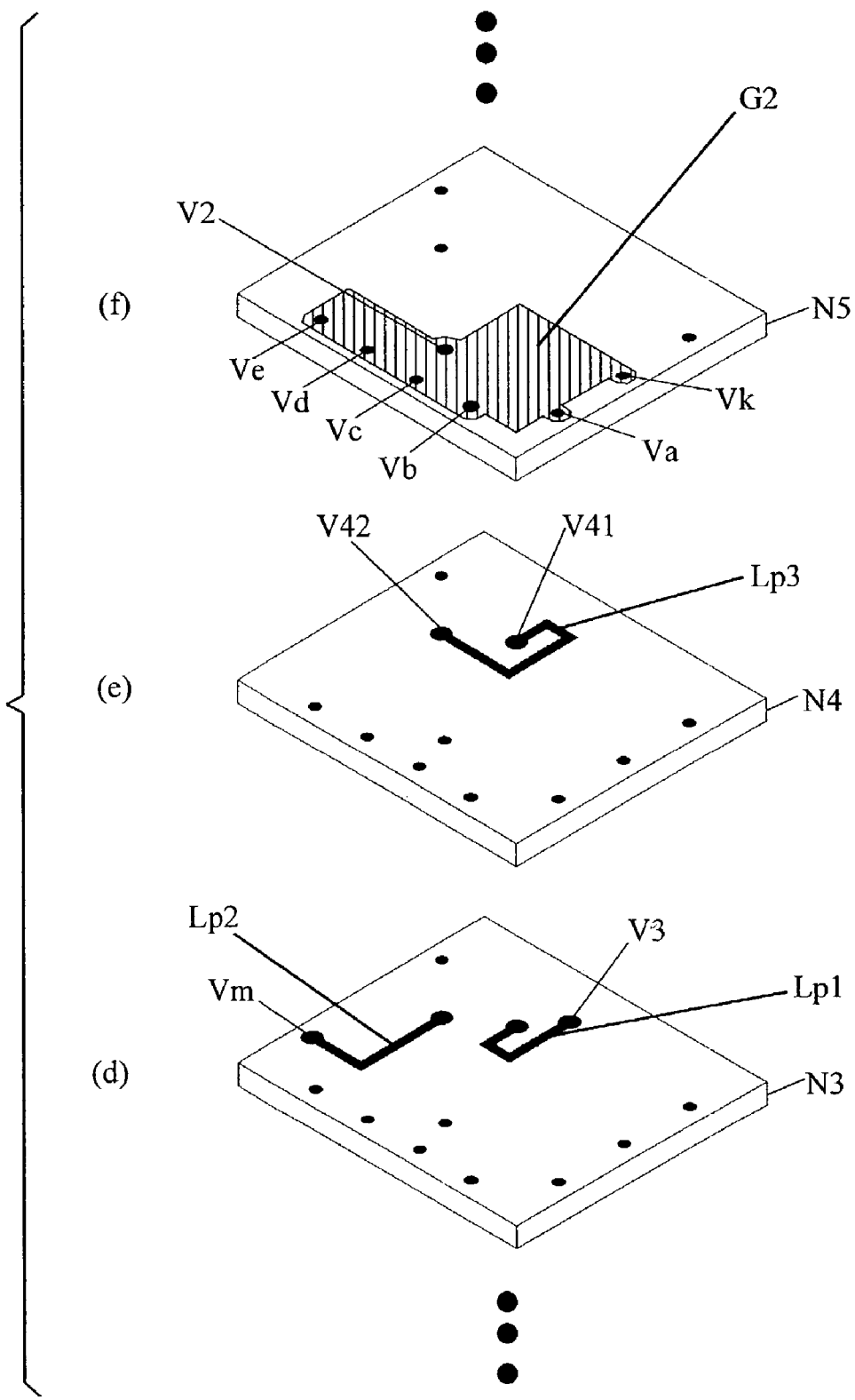
FIG. 7 is an illustration showing dielectric layers N3 through N5.
Figure 8:
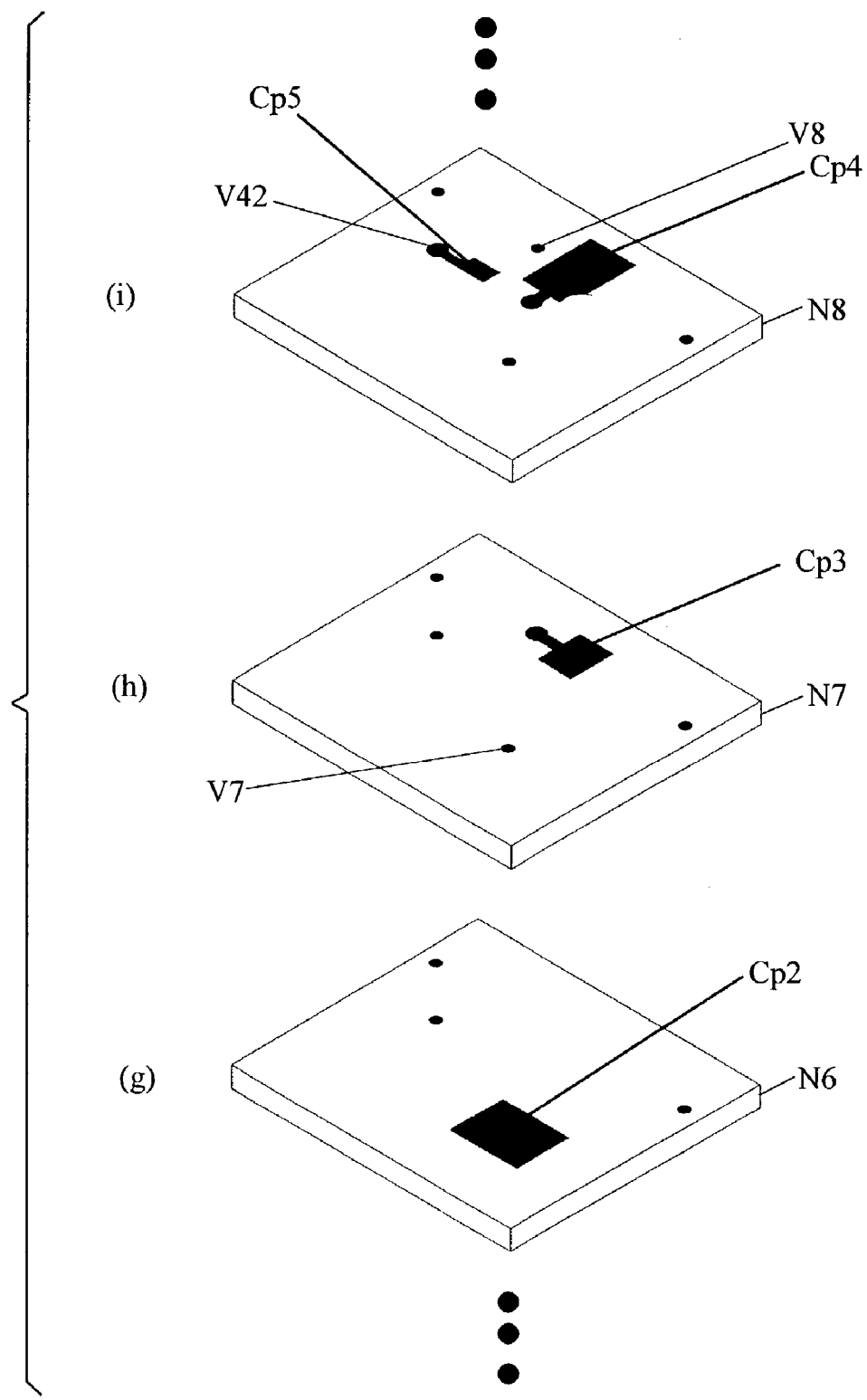
FIG. 8 is an illustration showing dielectric layers N6 through N8.
Figure 9:
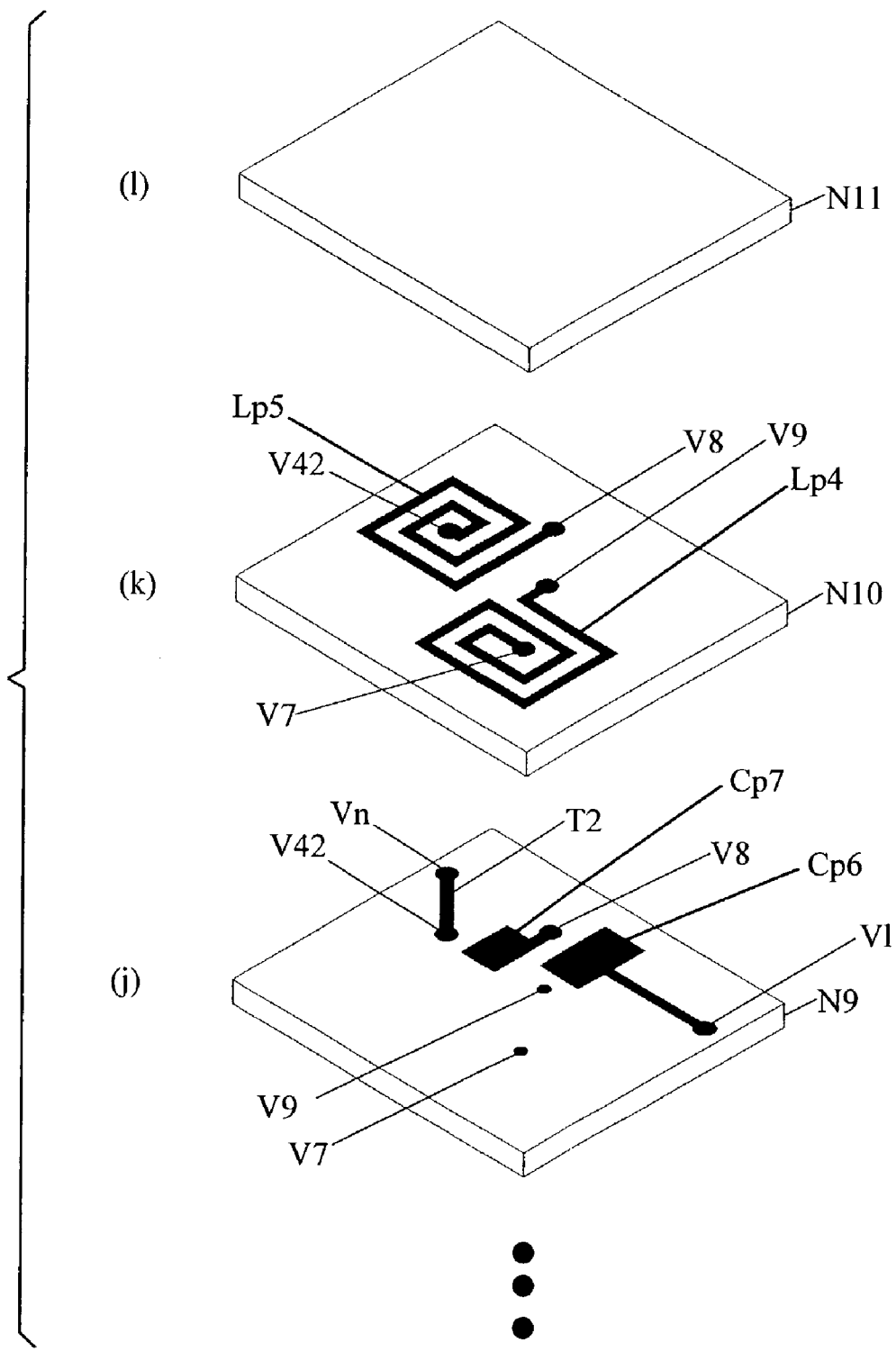
FIG. 9 is an illustration showing dielectric layers N9 through N11.

FIG. 6 is an illustration showing the dielectric layers N1 and N2, and a bottom surface Nb of the dielectric layer N1. FIG. 7 is an illustration showing the dielectric layers N3 through N5. FIG. 8 is an illustration showing the dielectric layers N6 through N8. FIG. 9 is an illustration showing the dielectric layers N9 through N11. The dielectric layers illustrated in FIGS. 6 through 9 are laminated with the dielectric layer N1 placed on the bottom and the dielectric layer N11 on the top. The number of layers of the lamination body is appropriately selected according to the required characteristics of the diplexer.

A method of manufacturing the lamination body for achieving the diplexer according to the second embodiment is described below. Assume herein that, as the lamination body, a so-called glass ceramic substrate is used, which is obtained by mixing low-melting glass frit with ceramic powders such as a compound whose main ingredient is a forsterite-base substance or alumina. First, in a green sheet obtained by molding slurry which is a mixture of the ceramic powders, an organic binder, and an organic solvent, a plurality of via holes for electrical connection of multi-layer wiring are bored through mechanical punching or laser processing.

Next, a conductive paste whose main ingredient is silver (or gold or copper) powders is printed on each green sheet for forming a wiring pattern. Furthermore, a conductive paste is filled and printed on each green sheet for connecting the wiring patterns of the green sheets with each other. Also, strip lines and capacitor electrodes are formed.

Next, eleven green sheets (that is, the dielectric layers N1 through N11) formed in the above-described manner are correctly aligned and sequentially laminated with each other, and are then warmed and pressured under a certain condition, thereby obtaining an integrated lamination body. This lamination body is dried, and is then burned at 400 to 500 degrees centigrade in a furnace in oxide atmosphere so that the organic binder in the green sheets are burned out. Next, the lamination body is burned in a temperature range from approximately 850 to 950 degrees centigrade in normal air when gold or silver powders are used for making the conductive paste, or in inert gas or reducing atmosphere when copper powders are used therefor, thereby resulting in a final lamination body.

With reference to FIGS. 6 through 9, a wiring pattern of each dielectric layer is described below. In FIG. 6, the dielectric layer N1 has the bottom surface Nb with a plurality of electrodes T1 formed thereon for mounting the lamination body on a main substrate. Formation of the electrodes T1 is carried out by printing and patterning the conductive paste as described above. On the other hand, the dielectric layer N1 has a top surface with a ground electrode G1 printed thereon. Also, the top surface of the dielectric layer N1 has via holes Va through Vk bored therein and connected to the ground electrode G1 and via holes V1 through Vn bored therein and not connected to the ground electrode G1. In the following description, in the dielectric layers N1 through N11, via holes connecting with each other are provided with the same reference characters. The dielectric layer N2 has a top surface with a capacitor electrode Cp1 formed by printing and a via hole V2 formed by boring.

In FIG. 7, the dielectric layer N3 has a top surface with a strip line electrode Lp1 provided thereon. One end of the strip line electrode Lp1 has a via hole V3 bored therein. The via hole V3 is bored at a position where the strip line electrode Lp1 is connected to the capacitor electrode Cp1. The top surface of the dielectric layer N3 is also provided with a strip line electrode Lp2, with one end thereof being bored to form a via hole Vm.

The dielectric layer N4 has a top surface with a strip line electrode Lp3 provided thereon, with one end thereof being bored to form a via hole V41 and the other end being bored to form a via hole V42. The via hole V41 is used for connection with the end of the strip line electrode Lp1 other than the via hole V3. The via hole V42 is used for connection with the end of the strip line electrode Lp2 not having the via hole Vm. The dielectric layer N5 has a top surface with a ground electrode G2 provided thereon for connection with the via holes Va to Ve and Vk.

In FIG. 8, the dielectric layer N6 has a top surface with a capacitor electrode Cp2 provided thereon. The dielectric layer N7 has a top surface with a capacitor electrode Cp3 provided thereon and a via hole V7 bored therein. The via hole V7 is used for connection with the capacitor electrode Cp2 of the dielectric layer N6. The dielectric layer N8 has a top surface with a capacitor electrode Cp4 and a capacitor electrode Cp5 provided thereon and a via hole V8 bored therein. The via hole V8 is used for connection with the capacitor electrode Cp3 of the dielectric layer N7. One end of the capacitor electrode Cp5 has a via hole V42 bored therein.

In FIG. 9, the dielectric layer N9 has a top surface with a capacitor electrode Cp6, a capacitor electrode Cp7, and an electrode T2 provided thereon, and a via hole V9 bored therein. The via hole V9 is used for connection with the capacitor electrode Cp4 of the dielectric layer N8. One end of the capacitor electrode Cp6 has a via hole V1 bored therein. One end of the capacitor electrode Cp7 has a via hole V8 bored therein. The capacitor electrode Cp7 is connected with the capacitor electrode Cp3 via the via hole V8. One end of the electrode T2 has a via hole V42 bored therein. The via hole V42 is used for connection with the capacitor electrode Cp5 of the dielectric layer N8. Also, the other end of the electrode T2 has a via hole Vn bored therein. The via hole Vn is used for connection with the electrode T1.

The dielectric layer N10 has a top surface with a coiled strip line electrode Lp4 and a strip line electrode Lp5 provided thereon. One end of the strip line electrode Lp4 has a via hole V9 bored therein. The via hole V9 is used for connection with the capacitor electrode Cp4 of the dielectric layer N8. Also, the other end of the strip line electrode Lp4 has a via hole V7 bored therein. The via hole V7 is used for connection with the capacitor electrode Cp2 of the dielectric layer N6.

One end of the strip line electrode Lp5 has a via hole V8 bored therein. The via hole V8 is used for connection with the capacitor electrode Cp7 of the dielectric layer N9. Also, the other end of the strip line electrode Lp5 has a via hole V42 bored therein. The via hole V42 is used for connection with the electrode T2 of the dielectric layer N9.

With the above structure, the inductor L1 of the LPF 82 is implemented by the strip line electrode Lp5. The capacitor C1 is implemented by the capacitor electrodes Cp5 and Cp7. The inductor L2 is implemented by the strip line electrodes Lp1 and Lp3. The capacitor C2 is implemented by the capacitor Cp1 and the ground electrode G1. The inductor L3 is implemented by the strip electrode Lp2.

The capacitor C3 of the HPF 83 is implemented by the capacitor electrodes Cp3 and Cp4. The capacitor C4 is implemented by the capacitor electrodes Cp4 and Cp6. The inductor L4 is implemented by the strip line electrode Lp4. The capacitor C5 is implemented by the capacitor electrode Cp2 and the ground electrode G2.

As such, the diplexer of the second embodiment is implemented as a lamination body by using dielectric layers. Thus, the device can be reduced in size and height.

The above-described wiring patterns has the following features. A first feature is that the capacitor electrode Cp1 is formed on the dielectric layer N2, which is upper than the dielectric layer N1 having the ground electrode G1 formed thereon, and the strip line electrodes Lp1 and Lp3 are formed on the dielectric layers N3 and N4, respectively, which are further upper than the dielectric layer N1, thereby forming the serial resonant circuit of the LPF 82.

Normally, unwanted stray capacitance occurs by overlaying the pattern of the strip line electrode or the like and the ground electrode with each other. Such occurrence of stray capacitance causes the laminated circuit to have circuitry different from the designed one. The different circuitry causes unwanted resonance, deteriorating the transmission characteristics. To get around this problem, with a capacitor electrode placed between the ground electrode and the strip line electrode, an overlaying portion between the strip line electrode and the ground electrode can be reduced. Thus, it is possible to reduce stray capacitance occurring between the strip line electrodes Lp1 and Lp3 forming the second inductor L2, and the ground electrode G1. Therefore, the circuitry of the lamination body becomes as designed, enabling the second inductor L2 and the second capacitor C2 to form a serial resonant circuit. With the serial resonant circuit, ideal steep attenuation poles can be provided, and the passband of the HPF 83 can be also widened and reduced in loss. The above description also applies to the relationship between the parallel resonant circuit formed by the first inductor L1 and the first capacitor C1 in the LPF 82 and the ground electrode.

Furthermore, the capacitor electrode Cp2 is formed on the dielectric layer N6, which is upper than the dielectric layer N5 having the ground electrode G2 formed thereon, and the strip line electrodes Lp4 is formed on the dielectric layer N10, which is further upper than the dielectric layer N6, thereby forming the serial resonant circuit of the HPF 83. With such configuration, stray capacitance occurring between the strip line electrode Lp4 forming the fourth inductor L4, and the ground electrode G2 can be reduced. Therefore, with the serial resonant circuit formed by the fourth inductor L4 and the fifth capacitor C5, ideal steep attenuation poles can be provided, and the passband of the LPF 82 can also be widened and reduced in loss.

That is to say, in the resonant circuit formed by an inductor and a capacitor for providing an attenuation pole, a strip line electrode that forms the inductor is placed on a layer upper than a layer having the ground electrode and the capacitor electrode that form the capacitor. With this configuration, steeper attenuation poles can be formed, and a wide-band, low-loss low-pass filter and high-pass filter can be provided.

A second feature of the above-described wiring patterns is described below. The strip line electrode Lp5 forming the inductor L1 in the LPF 82 is placed on a layer that is upper than a layer having the ground electrode G1 and is equal to or upper in the lamination direction than a layer having the strip line electrodes Lp1 and Lp3 that form the inductor L2 of the LPF 82 and a layer having the strip line electrode Lp4 that forms the inductor L4 of the HPF 83. With such configuration, unwanted stray capacitance occurring between the strip line electrode forming the inductor L1 of the LPF 82, and the ground electrode or other electrode patterns can be reduced. Therefore, it is possible to reduce changes in characteristic of the inductor L1 of the LPF 82 through which the signal directly passes, thereby providing a diplexer having circuitry as designed.

That is, the strip line electrode forming the inductor through which the signal directly passes in the LPF is placed on a layer that is upper than a layer having the ground electrode and equal to or upper than a layer having the strip line electrode forming another inductor of the LPF and a layer having the strip line electrode forming the inductor of the HPF. With such configuration, unwanted stray capacitance occurring between the strip line electrode forming the inductor through which the signal directly passes in the LPF 82 and the ground electrode or other electrode patterns can be reduced. Therefore, it is possible to reduce changes in the characteristics of the inductor through which the signal directly passes, thereby providing a diplexer having circuitry as designed.

Furthermore, all input/output terminals and the ground electrode of the diplexer according to the second embodiment are concentrated on the bottom surface of the dielectric layer N1 through the via holes. Therefore, an area for implementation on a main substrate of an electronic device can be reduced.

Wiring of the electrodes as illustrated in FIG. 5 is merely an example, and is not meant to be restrictive. Specifically, although the inductor L1 of the LPF 82 is implemented by a single strip line electrode Lp5 in the second embodiment, the inductor L1 may be implemented by a plurality of strip line electrodes. Similarly, other inductors are implemented by at least one strip line electrode. In any event, the effects of the present invention can be achieved as long as the wiring has the above-described features.

(Third Embodiment)

A high-frequency switch according to a third embodiment of the present invention uses the diplexer according to the first embodiment, and is implemented by a lamination body formed by laminating a plurality of dielectric layers. FIG. 1 is also referred to in the third embodiment. The components having functions similar to those of the diplexer in the first embodiment are provided with the same reference characters, and are not described herein.

Figure 10:
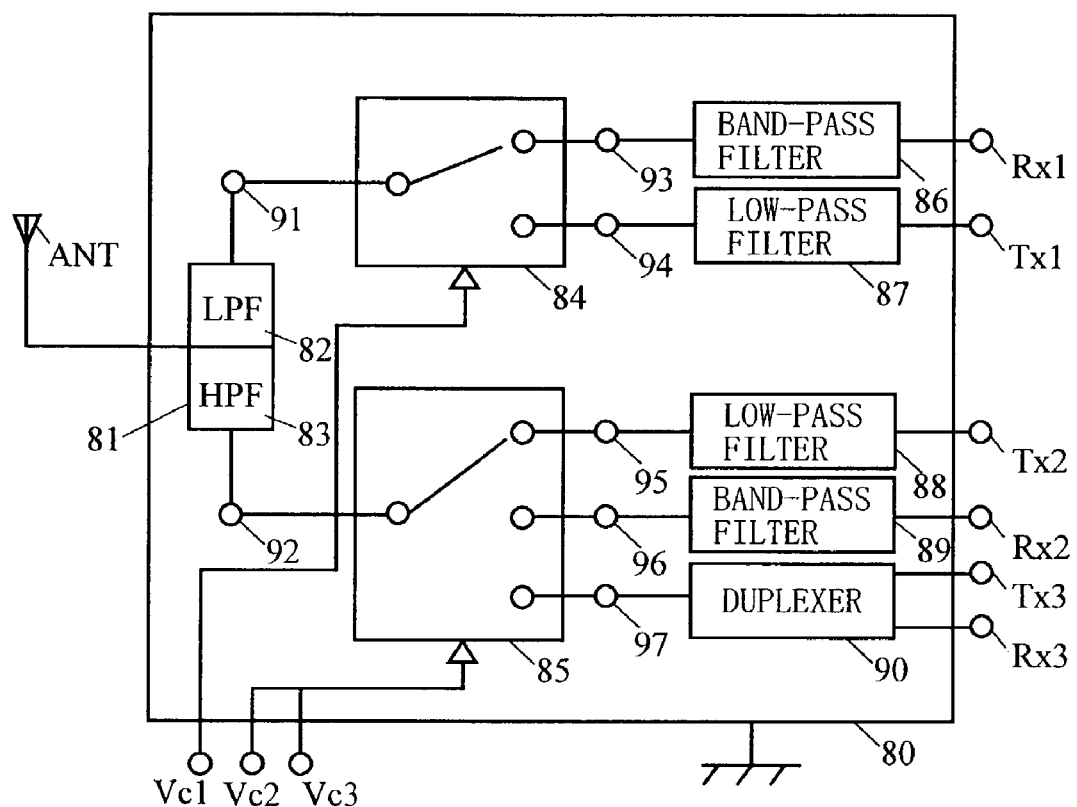
FIG. 10 is a block diagram illustrating a functional structure of a high-frequency switch according to a third embodiment.

FIG. 10 is a block diagram illustrating a functional structure of the high-frequency switch according to the third embodiment. In FIG. 10, a high-frequency switch 80 is a triple-band high-frequency switch having a filtering function of passing a transmission frequency band and a reception frequency band of a first frequency band (EGSM), a second frequency band (DCS), and a third frequency band (UMTS). The high-frequency switch 80 includes a switching circuit (transmission and reception switching circuit) 84, a switching circuit 85, a diplexer 81, band-pass filters 86 and 89, low-pass filters 87 and 88, and a duplexer 90.

For signals of the EGSM scheme, the band-pass filter 86 and the low-pass filter 87 are connected to a reception terminal Rx1 and a transmission terminal Tx1, respectively. For signals of the DCS scheme, the low-pass filter 88 and the band-pass filter 89 are connected to a transmission terminal Tx2 and a reception terminal Rx2, respectively. For signals of the UMTS scheme, the duplexer 90 is connected to both a transmission terminal Tx3 and a reception terminal Rx3.

The band-pass filter 86 and the switching circuit 84 are connected to each other via an internal terminal 93. The low-pass filter 87 and the switching circuit 84 are connected to each other via an internal terminal 94. The switching circuit 84 is connected to the LPF 82 of the diplexer 81 via an internal terminal 91.

The low-pass filter 88 and the switching circuit 85 are connected to each other via an internal terminal 95. The band-pass filter 89 and the switching circuit 85 are connected to each other via an internal terminal 96. The duplexer 90 and the switching circuit 85 are connected to each other via an internal terminal 97. The switching circuit 85 is connected to the HPF 83 of the diplexer 81 via an internal terminal 92. The diplexer 81 is connected to an antenna ANT.

The band-pass filter 86 uses, for example, an SAW filter that passes only a signal in a frequency band corresponding to a reception signal of the EGSM scheme. The low-pass filter 87 is a filter that passes a signal in a frequency band lower than a frequency band corresponding to a transmission signal of the EGSM scheme, and is provided to reduce harmonic distortion caused by amplification. The band-pass filter 89 uses, for example, an SAW filter that passes only a signal in a frequency band corresponding to a reception signal of the DCS scheme. The low-pass filter 88 is a filter that passes a signal in a frequency band lower than a frequency band corresponding to a transmission signal of the DCS scheme, and is provided to reduce harmonic distortion caused by amplification.

The duplexer 90 is made from dielectric material for separating a transmission frequency band and a reception frequency band from each other. The duplexer 90 includes, for example, a band-pass filter connected to the transmission terminal Tx3 and a band-pass filter connected to the reception terminal Rx3. The duplexer 90 is used in the UMTS scheme, where transmission and reception are carried out exactly at the same time, in order to protect a reception signal from a transmission signal.

The switching circuit 84 switches to the internal terminal 93 when supplied with a transmission signal in the frequency band of the EGSM scheme, and to the internal terminal 94 when supplied with a reception signal in the frequency band of the EGSM scheme. The switching circuit 84 carries out this internal terminal switching operation based on an applied voltage (3V) to a control terminal Vc1. With the voltage applied, the switching circuit 84 switches to the internal terminal 94 for signal transmission.

The switching circuit 85 switches to the internal terminal 95 when supplied with a transmission signal in the frequency band of the DCS scheme, to the internal terminal 96 when supplied with a reception signal in the frequency band of the DCS scheme, and to the internal terminal 97 when supplied with a signal in the frequency band of the UMTS scheme. The switching circuit 85 carries out this internal terminal switching operation based on an applied voltage (3V) to control terminals Vc2 and Vc3. With the voltage applied to the control terminal Vc2, the switching circuit 85 switches to the internal terminal 95 for transmitting the signal of the DCS scheme. With the voltage applied to the control terminal Vc3, the switching circuit 85 switches to the internal terminal 96 for receiving the signal of the DCS scheme. With no voltage applied to the control terminals Vc2 and Vc3, the switching circuit 85 switches to the internal terminal 97 for transmitting or receiving a signal of the UMTS scheme.

The operation of the above-structured high-frequency switch 80 is described below. Note that the operation of the diplexer 81 has been described in detail in the first embodiment, and therefore is not described herein.

For transmission of a signal of the EGSM scheme, 3V is applied to the control terminal Vc1 of the switching circuit 84, and 0V is applied to the control terminals Vc2 and Vc3 of the switching circuit 85. With this, the internal terminal 91 and the internal terminal 94 become connected to each other. The transmission signal of the EGSM scheme is supplied to the transmission terminal Tx1; forwarded to the low-pass filter 87, where harmonic distortion is reduced; further forwarded through the switching circuit 84 to the LPF 82 of the diplexer 81; passed through the LPF 82; and then output from the antenna ANT.

For reception of a signal of the EGSM scheme, 0V is applied to the control terminals Vc1 through Vc3 of the switching circuits 84 and 85 for connecting the internal terminal 91 and the internal terminal 93 to each other. The reception signal of the EGSM scheme is supplied via the antenna ANT to the diplexer 81. The reception signal is then passed not through the HPF 83 but through the LPF 82, and is then forwarded through the switching circuit 84 to the band-pass filter 86. The band-pass filter 86 passes only a required band of the reception signal, and then sends it to the reception terminal Rx2. In this manner, the reception signal of the EGSM scheme is extracted from the reception terminal Rx2.

For transmission of a signal of the DCS scheme, 3V is applied to the control terminal Vc2 of the switching circuit 85, and 0V is applied to the control terminal Vc1 of the switching circuit 84 and the control terminal Vc3 of the switching circuit 85. With this, the internal terminal 92 and the internal terminal 95 become connected to each other. The transmission signal of the DCS scheme is supplied to the transmission terminal Tx2; forwarded to the low-pass filter 88, where harmonic distortion is reduced; further forwarded through the switching circuit 85 to the HPF 83 of the diplexer 81; passed through the HPF 83; and then output from the antenna ANT.

For reception of a signal of the DCS scheme, 3V is applied to the control terminal Vc3 of the switching circuit 85, and 0V is applied to the control terminal Vc1 of the switching circuit 84 and the control terminal Vc2 of the switching circuit 85. With this, the internal terminal 92 and the internal terminal 96 become connected to each other. The reception signal of the DCS scheme is supplied through the antenna to the diplexer 81. The reception signal of the DSC scheme supplied to the diplexer 81 passes not through the LPF 82 but through the HPF 83, and is then forwarded through the switching circuit 85 to the band-pass filter 89. The band-pass filter 89 passes only a required band of the reception signal, and then sends it to the reception terminal Rx2. In this manner, the reception signal of the DCS scheme is extracted from the reception terminal Rx2.

For transmission of a signal of the UMTS scheme, 0V is applied to the control terminals Vc1 through Vc3 of the switching circuit 84 and the switching circuit 85. With this, the internal terminal 92 and the internal terminal 97 become connected to each other. The transmission signal of the UMTS scheme is supplied to the transmission terminal Tx3, and is then forwarded through the duplexer 90, the switching circuit 85, and the diplexer 81 to the antenna ANT. For reception of a signal of the UMTS scheme, the same connection as mentioned above is established. The reception signal of the UMTS scheme is forwarded from the antenna ANT through the diplexer 81, the switching circuit 85, and the duplexer 90 to the reception terminal Rx3 for extraction.

Figure 11:
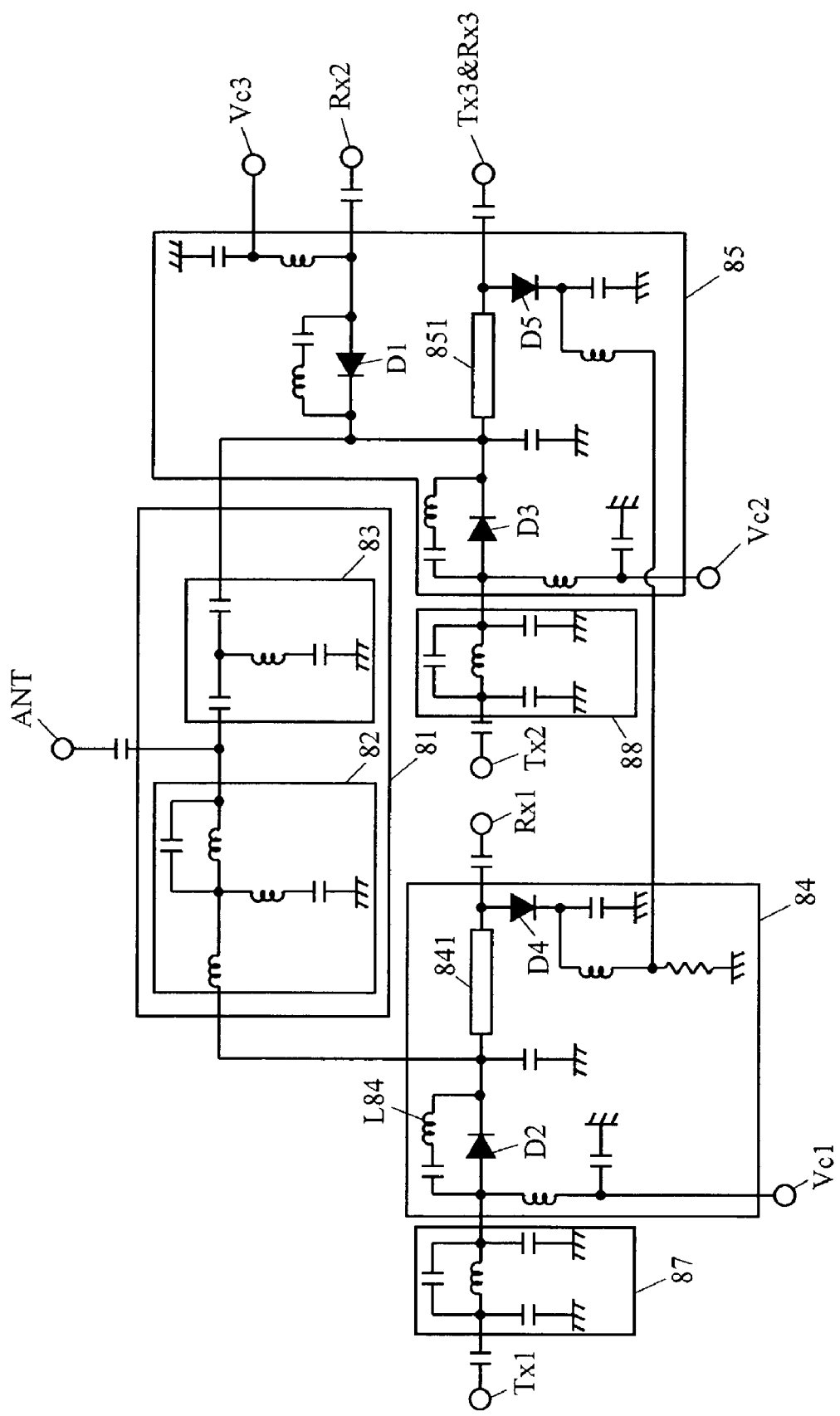
FIG. 11 is a circuit diagram illustrating part of the high-frequency switch 80 according to the third embodiment.

FIG. 11 is a circuit diagram showing part of the high-frequency switch 80 according to the third embodiment. The circuit of the high-frequency switch illustrated in FIG. 11, the exemplarily uses diodes. In FIG. 11, although circuits of the band-pass filter 86, the band-pass filter 89, and the duplexer 90 are not shown, those generally used can be provided so as to be connected to the transmission terminals Rx1, Rx2, and Tx3 and Rx3, respectively. The circuit of the diplexer 81 is similar to that in the first embodiment.

The transmission terminal Tx1 is connected to the antenna side through a diode D2 conducting in the forward direction for transmission. The low-pass filter 87 is inserted between the transmission terminal Tx1 and the diode D2. The reception terminal Rx1 is connected to the antenna side, and is grounded through a diode D4 conducting in the forward direction. The control terminal Vc1 is connected to a section for controlling an applied voltage (not shown).

The transmission terminal Tx2 is connected to the antenna side through a diode D3 conducting in the forward direction for transmission. The low-pass filter 88 is inserted between the transmission terminal Tx2 and the anode of the diode D3. The reception terminal Rx2 is connected to the antenna side through the diode D1 conducting in the backward direction (in OFF state) for transmission by using the transmission terminal Tx2.

The transmission terminal Tx3 and the reception terminal Rx3 are connected to the antenna side and grounded through a diode D5 conducting in the forward direction. The control terminals Vc2 and Vc3 are connected to the section for controlling the applied voltage (not shown).

The operation of the part of the circuit of the high-frequency switch illustrated in FIG. 11 is described below. The circuits of the low-pass filters 87 and 88 and the circuits of the switching circuits 84 and 85 are well known, and therefore are only described briefly. Also, the operation of the circuit of the diplexer 81 is the same as that of the first embodiment, and therefore is not described herein.

The transmission signal of the EGSM scheme supplied to the transmission terminal Tx1 is forwarded to the low-pass filter 87. In the low-pass filter 87, the parallel resonant circuit resonates with the harmonics of the signal, and transmits only the fundamentals of the signal to the switching circuit 84. For transmission of a signal of the EGSM scheme, the control terminal Vc1 is applied with a voltage of 3V, and therefore the diode D2 enters an ON state. Consequently, the transmission signal passes through the diode D2. The impedance at the cathode side of the diode D2 is significantly increased by the action of a 50 Ω line 841 whose wavelength is a quarter of the wavelength of the transmission frequency of the EGSM scheme. Therefore, the signal is transmitted to the diplexer 81. The signal is then output through the diplexer 81 from the antenna ANT.

The reception signal of the EGSM scheme is forwarded from the antenna ANT through the diplexer 81 to the switching circuit 84. For reception of a signal of the EGSM scheme, the control terminal Vc1 is applied with a voltage of 0V, and therefore the diode D2 serves as a capacitor by a terminal-to-terminal capacitance, and forms a parallel resonant circuit in cooperation with an inductor L84. The parallel resonant circuit resonates in the receive frequency band of the EGSM scheme. When the parallel resonant circuit resonates, the impedance is significantly increased. Therefore, the reception signal is transmitted to the reception terminal Rx1.

For transmission of a signal of the DCS scheme from the transmission terminal Tx2, the control terminal Vc2 is applied with a voltage of 3V. The circuitry around the diode D3 is similar to the circuitry around the diode D2. Therefore, with an operation similar to the operation for transmission of a signal of the EGSM scheme from the transmission terminal Tx1, the transmission signal is sent to the diplexer 81.

For reception of a signal of the DCS scheme, the control terminal Vc3 is applied with 3V, and the control terminal Vc2 is applied with 0V. Thus, the diode D1 enters an ON state, and the impedance of the parallel resonant circuit formed by a terminal-to-terminal capacitance with the diode D3 is significantly increased. The impedance at the anode side of the diode D5 is significantly increased by the action of a 50 Ω line 851 whose wavelength is a quarter of the wavelength of the transmission frequency of the DCS scheme. Therefore, the reception signal of the DCS scheme is transmitted to the reception terminal Rx2.

For transmission of a signal of the UMTS scheme from the transmission terminal Tx3, the control terminals Vc2 and Vc3 are applied with a voltage of 0V. Therefore, the diodes D1 and D3 each form a parallel resonant circuit by a terminal-to-terminal capacitance. The impedances of these two parallel resonant circuits is significantly large, and the transmission signal of the UMTS scheme is transmitted to the diplexer 81, and output from the antenna ANT. As to the reception signal of the UMTS scheme, the switching circuit 85 operates similarly.

Figure 12:
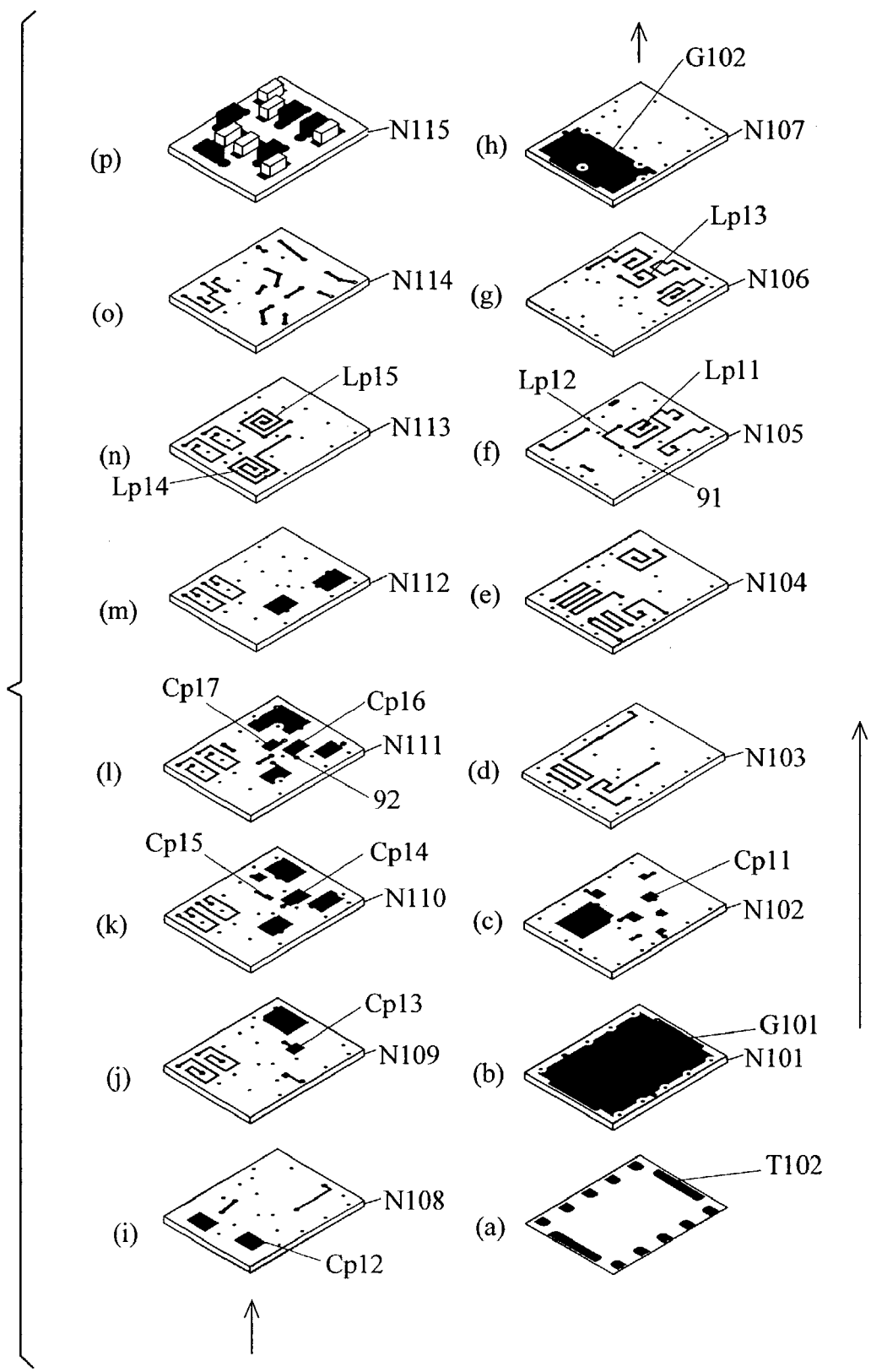
FIG. 12 is an exploded perspective view of a lamination body achieving a circuit for the high-frequency switch illustrated in FIG. 11 by laminating a plurality of dielectric layers.

FIG. 12 is an exploded perspective view of a lamination body achieving a circuit for the high-frequency switch illustrated in FIG. 11 by laminating a plurality of dielectric layers. Of the components illustrated in FIG. 11, capacitors at input/output ends of the transmission terminals Tx1, Tx2, Tx3 and Rx3, and the reception terminals Rx1 and Rx2, and capacitors inserted between the control terminals Vc1 through Vc3 and the ground are not illustrated in the wiring patterns of the dielectric layers and on the top surface of each dielectric layer in FIG. 12.

As illustrated in FIG. 12, the lamination body of the high-frequency switch is structured by fifteen dielectric layers N101 through N115. FIGS. 13, 14, 15, and 16 are enlarged perspective views of each dielectric layer of the high-frequency switch illustrated in FIG. 12. In FIG. 12, (a) through (p) provided to the dielectric layers respectively correspond to (a) through (p) in FIGS. 13 through 16. Also, an arrow shown in FIG. 12 indicates a direction in which the dielectric layers are laminated.

Figure 13:
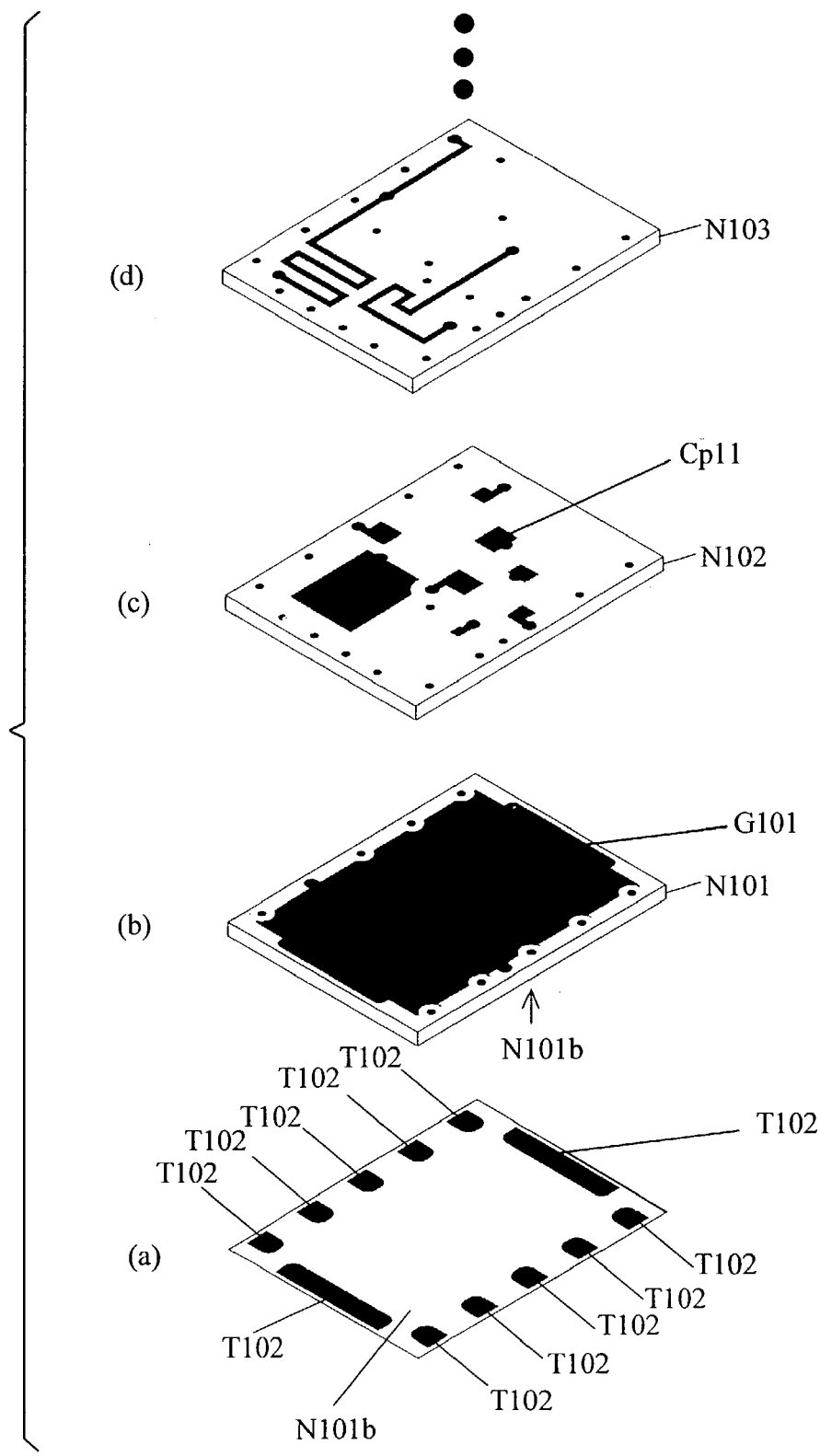
FIG. 13 is an illustration showing dielectric layers N101 through N103 and a bottom surface N101b of the dielectric layer N101.
Figure 14:
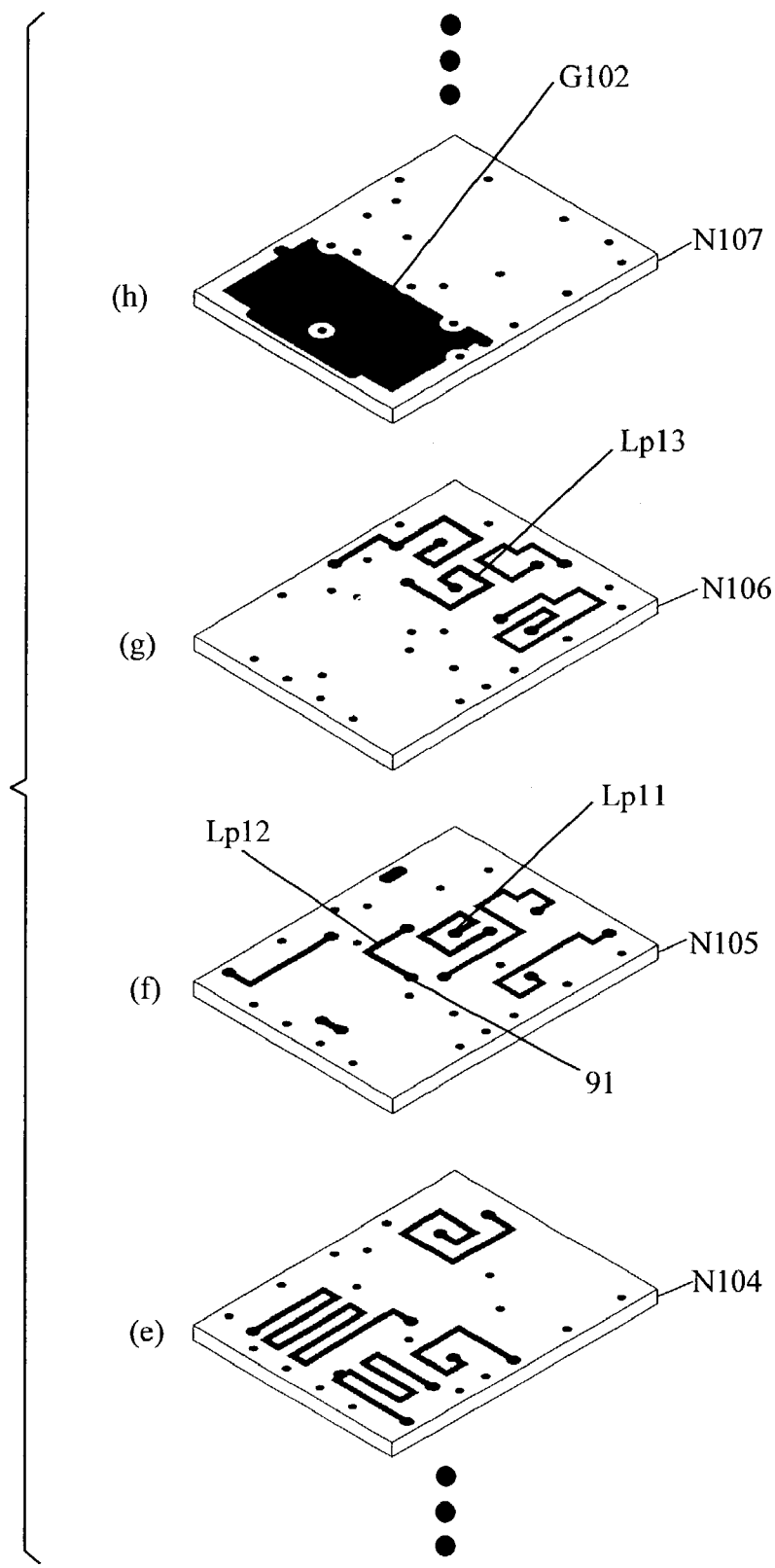
FIG. 14 is an illustration showing dielectric layers N104 through N107.
Figure 15:
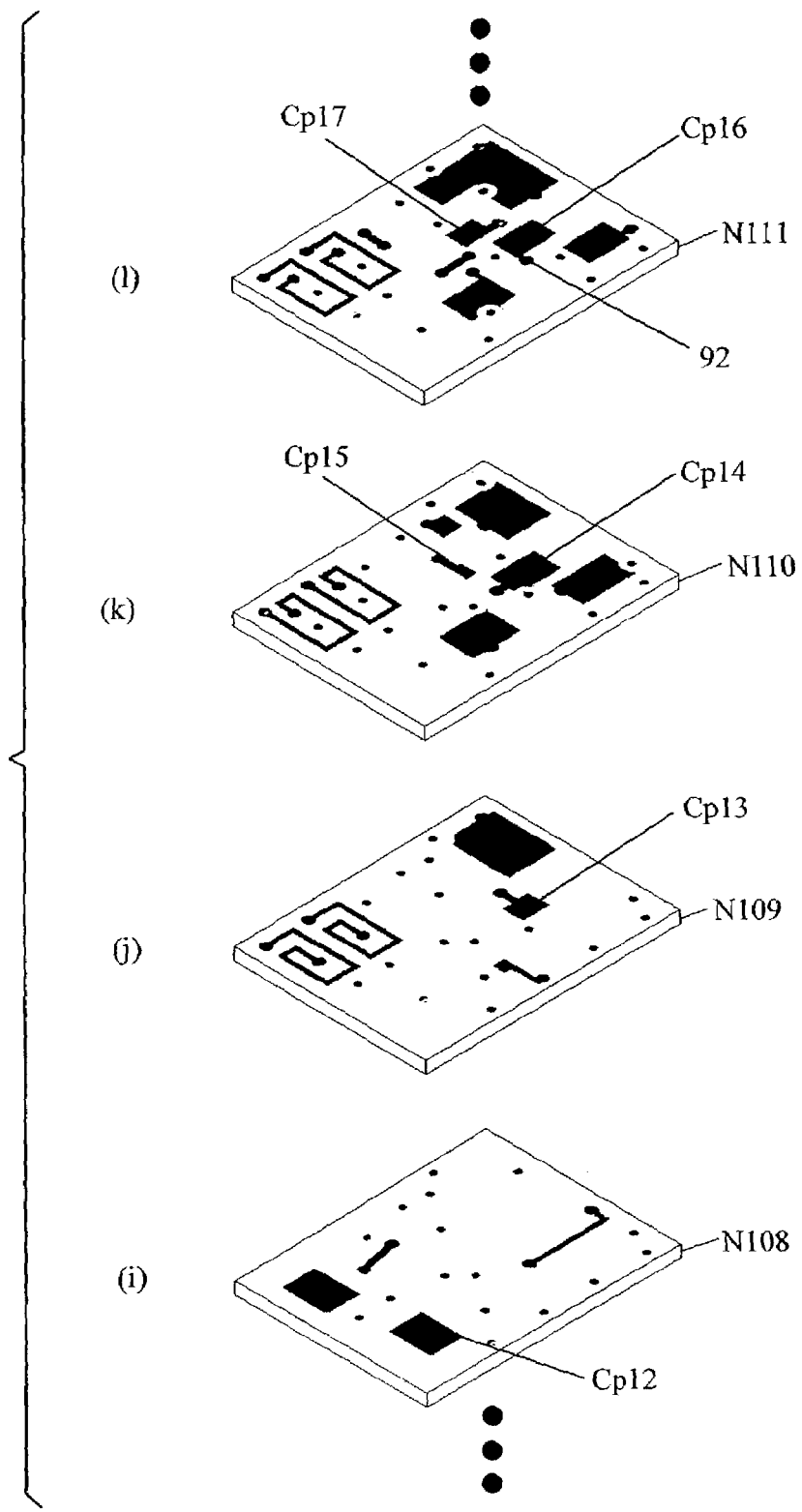
FIG. 15 is an illustration showing dielectric layers N108 through N111.
Figure 16:
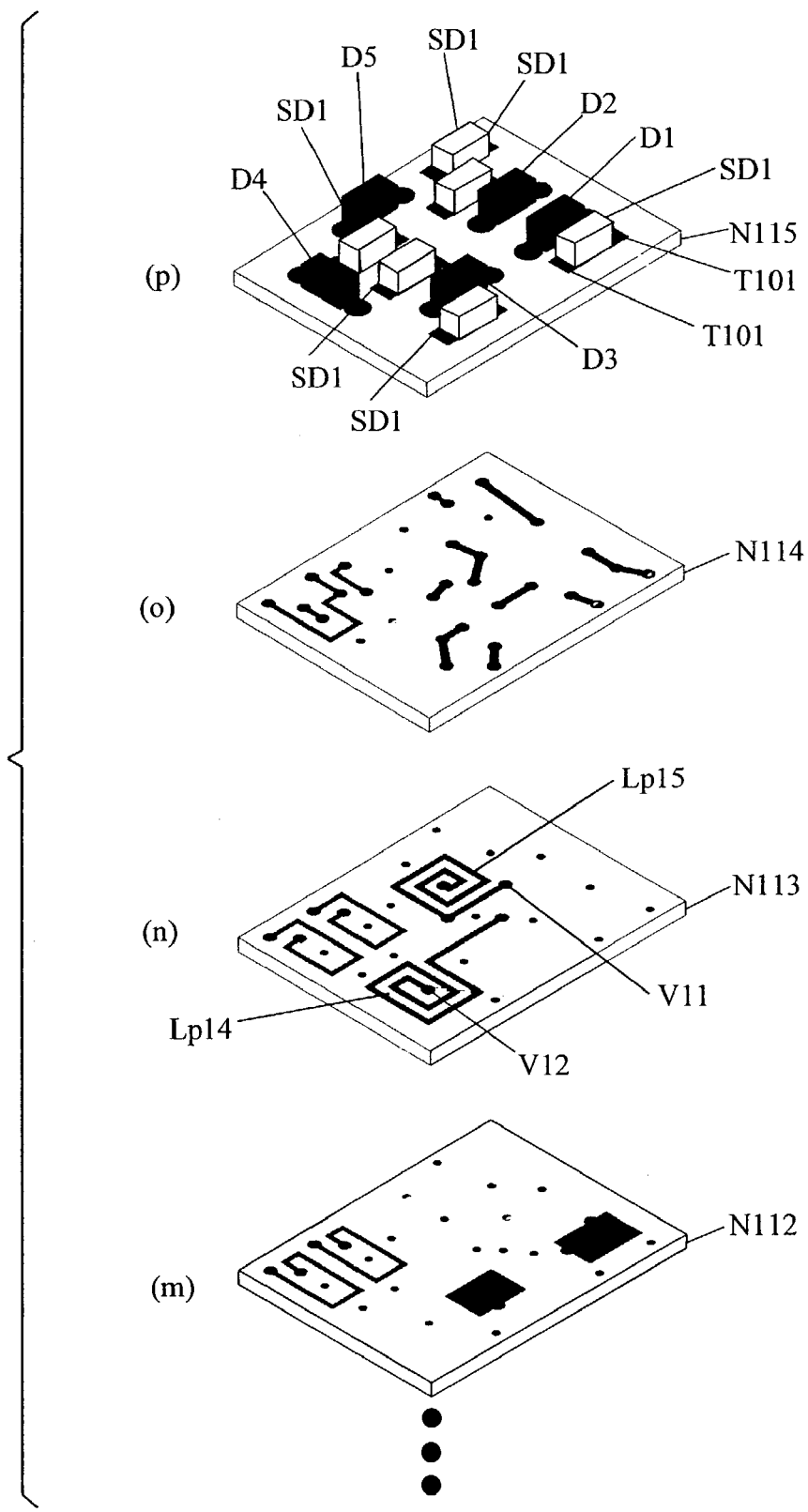
FIG. 16 is an illustration showing dielectric layers N112 through N115.

FIG. 13 is an illustration showing the dielectric layers N101 and N103, and a bottom surface N101b of the dielectric layer N101. FIG. 14 is an illustration showing the dielectric layers N104 through N107. FIG. 15 is an illustration showing the dielectric layers N108 through N111. FIG. 16 is an illustration showing the dielectric layers N112 through N115. The dielectric layers illustrated in FIGS. 13 through 16 are laminated with the dielectric layer N101 placed on the bottom and the dielectric layer N115 on the top. In FIG. 16, the dielectric layer N115 on the top of the lamination body of the high-frequency switch has a top surface having five diodes D1 through D5 and a plurality of chip components SD1 including a capacitor and a resistor that have not been patterned on the other dielectric layers. These diodes and chip components are electrically connected to the internal circuits of the lamination body. The number of layers of the lamination body is appropriately selected according to the required characteristics of the high-frequency switch. How to form the dielectric layers and the lamination body are similar to that in the second embodiment, and therefore is not described herein.

In FIG. 13, the bottom surface N101b of the dielectric layer N101 has a plurality of electrodes T102 for implementing the high-frequency switch on a main substrate of an electronic device. These electrodes T102 are formed by printing and patterning a dielectric paste, as described in the second embodiment.

The lamination structure of the wiring pattern of the multi-layered high-frequency switch as illustrated in FIGS. 13 through 16 is described by centering on the diplexer 81.

The dielectric layers N101 and N107 have ground electrodes G101 and G102 printed thereon, respectively (refer to FIGS. 13 and 14). The dielectric layers N102, N108 through N111 have top surfaces having capacitor electrodes Cp11 through Cp17 printed thereon (refer to FIGS. 13 and 15). The dielectric layers N105, N106, and N113 have strip line electrodes Lp11 through Lp15 printed thereon (refer to FIGS. 14 and 16).

Furthermore, the dielectric layers N102 through N113 have a plurality of via holes provided thereon for electrically connecting the strip line electrodes Lp11 through Lp15 and the capacitor electrodes Cp11 through Cp17 together so as to bring these electrodes into correspondence with the circuit diagram illustrated in FIG. 11. For example, the strip line electrode Lp15 is connected to the capacitor electrode Cp17 via a via hole V11. The strip line electrode Lp14 is connected to the capacitor electrode Cp12 via a via hole V12.

With the above structure, the strip line electrodes Lp11 through Lp13 and Lp15 form the inductor of the LPF 82, while the capacitor electrodes Cp11, Cp15, Cp17 and the ground electrode G101 form the capacitor of the LPF82. Consequently, the LPF 82 is formed.

Also, the strip line electrode Lp14 forms the inductor of the HPF 83, while the capacitor electrodes Cp12 through Cp14, Cp16, and the ground electrode G102 form the capacitor of the HPF 83. Consequently, the HPF 83 is formed.

The strip line electrodes, the capacitor electrodes, and the ground electrodes for forming the LPF 82 and the HPF 83 are placed so as to have features similar to those that have been described in the second embodiment. With these features, the diplexer 81 can obtain effects similar to those in the second embodiment.

Similarly, the low-pass filters 87 and 88 are formed by combining the strip line electrodes, the capacitor electrodes, and the ground electrodes that have been patterned on the dielectric layers.

Furthermore, the inductors and the capacitors of the switching circuits 84 and 85 are also formed by combining the strip line electrodes, the capacitor electrodes, and the ground electrodes that have been patterned on the dielectric layers. The switching circuits 84 and 85 can be achieved by electrically connecting the inductors and the capacitors of the switching circuits 84 and 85 formed in the above-described manner, the diodes D1 through D5, and the chip components SD1 implemented on the top surface of the lamination body through a plurality of electrodes T101 (in FIG. 16, two electrodes T101 are exemplarily illustrated). Furthermore, inside the lamination body, the diplexer 81 is connected to the switching circuits 84 and 85 through the internal terminals 91 and 92.

The band-pass filters 86 and 89, and the duplexer 90 illustrated in FIG. 10 are electrically connected, on a main substrate of an electronic device, to the reception terminals Rx1 and Rx2, the transmission terminal Tx3, and the reception terminal Rx3 of the switching circuits structured by the lamination body.

As described above, according to the third embodiment, the high-frequency switch is achieved as a lamination body by using dielectric layers. Thus, the device can be reduced in size and height. Also, with the use of the diplexer according to the first embodiment, it is possible to provide a high-frequency switch capable of passing high-frequency signals over a wide frequency band without being attenuated.

Furthermore, all of the input/output terminals and the ground electrodes of the high-frequency switch are concentrated on the bottom surface of the lamination body via the via holes. Thus, it is possible to reduce an area of the high-frequency switch when implemented on the main substrate of the electronic device.

In the third embodiment, the high-frequency switch is exemplarily used in combination of three schemes, that is, the EGSM, DCS, and UMTS schemes. Alternatively, the high-frequency switch may be similarly used in combination of other schemes, such as the EGSM, DCS, and PCS schemes.

In the third embodiment, the high-frequency switch is exemplarily a triple-band high-frequency switch using three communications systems. Alternatively, the high-frequency switch may be dual-band high-frequency switch using two communications systems (for example, using the EGSM and UMTS schemes), or may be a high-frequency switch using four or more communications systems (for example, using the EGSM, AMPS, DCS, PCS schemes) for achieving effects similar to those in the third embodiment.

Figure 17:
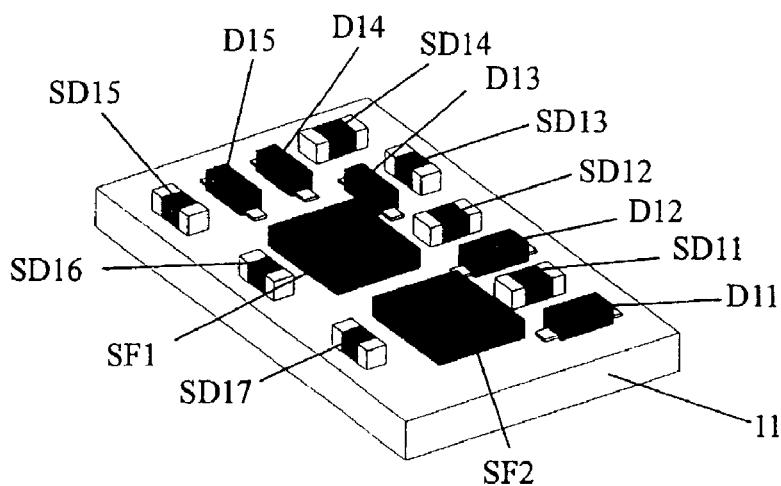
FIG. 17 is an illustration of the lamination body with band-pass filers mounted thereon.

In the third embodiment, the band-pass filters and the duplexer are provided on the main substrate of the electronic device, and are electrically connected to the reception terminals Rx1 and Rx2 and the transmission terminal Tx3 and the reception terminal Rx3 of the switching circuits formed in the lamination body. Alternatively, the band-pass filters may be implemented on the top surface of the lamination body. FIG. 17 is an illustration of the lamination body with band-pass filers mounted thereon. As illustrated in FIG. 17, SAW filters SF1 and SF2 to be used as the band-filters may be implemented on the top surface of the lamination body 11 together with diodes D11 to D15 and chip components SD11 through SD17 such as the capacitor and the resistors, thereby obtaining effects similar to those in the third embodiment.

Still alternatively, only the duplexer may be implemented on the top surface of the lamination body, or both the band-pass filters and the duplexer may be implemented on the top surface of the lamination body, thereby obtaining effects similar to those in the third embodiment.

In the third embodiment, diodes are used as the switching circuits. Alternatively, a GaAs (gallium arsenide) switch using gallium arsenide may be used as a semiconductor for only either one of the switching circuits, or such GaAs switches may be used for both of the switching circuits, thereby obtaining effects similar to those in the third embodiment.

(Fourth Embodiment)

In the fourth embodiment, an antenna duplexer using the diplexer according to the first embodiment is described. FIG. 1 is also referred to in the fourth embodiment. The components having functions similar to those of the diplexer in the first embodiment are provided with the same reference characters, and are not described herein.

Figure 18:
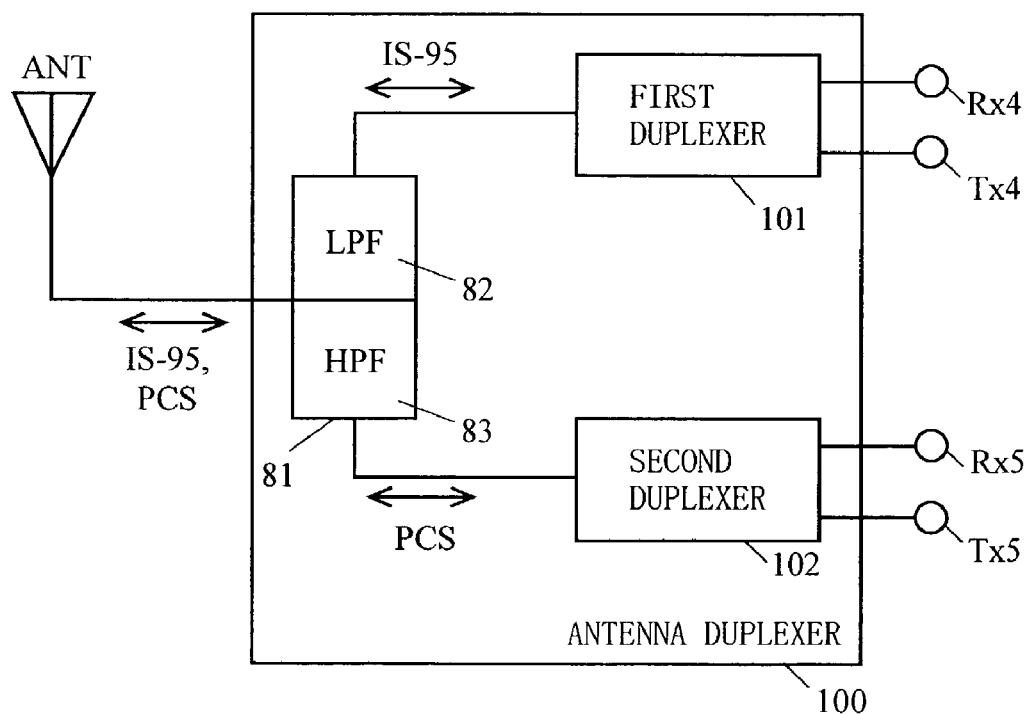
FIG. 18 is a block diagram illustrating the structure of an antenna duplexer 100 according to a fourth embodiment.
Figure 19:
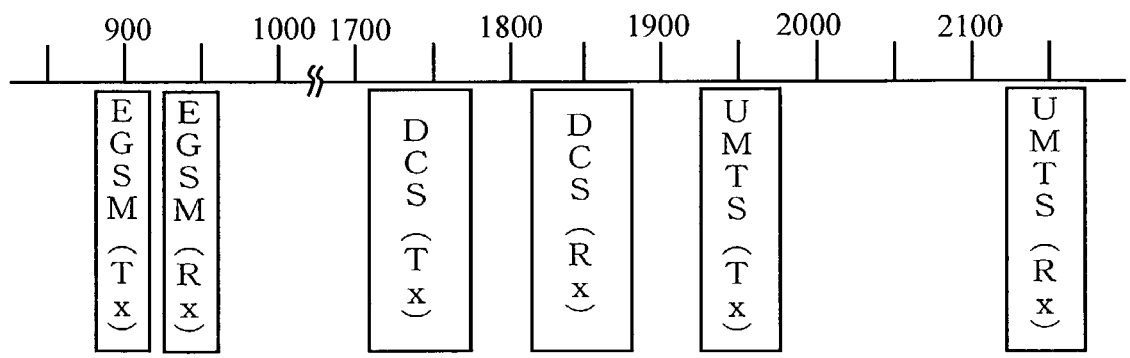
FIG. 19 is an illustration showing frequency bands used in the EGSM scheme, the DCS scheme, and the UMTS scheme.
Figure 20:
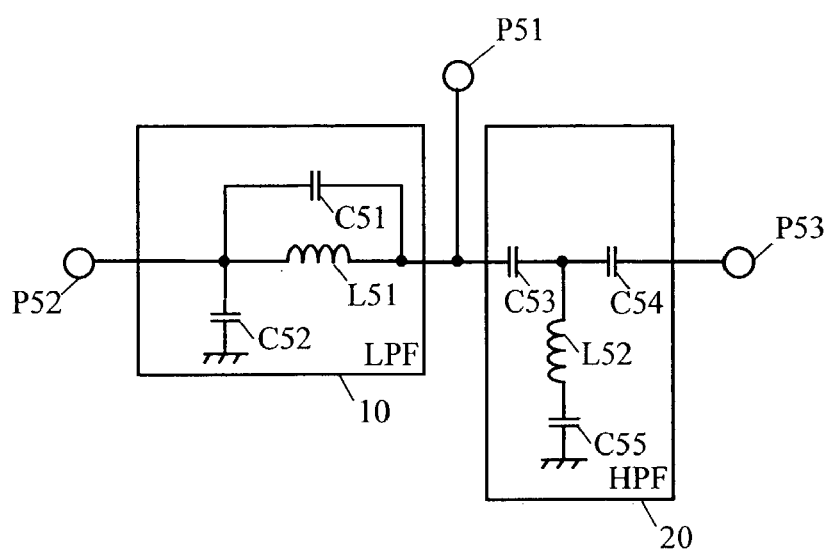
FIG. 20 is an illustration showing an equivalent circuit of a conventional diplexer.

FIG. 18 is a block diagram illustrating the structure of an antenna duplexer 100 according to the fourth embodiment. In FIG. 18, the antenna duplexer 100 includes a diplexer 81, a first duplexer 101, and a second duplexer 102. The antenna duplexer 100 transmits and receives a signal of the IS-95 scheme or the PCS scheme through the antenna ANT.

In the IS-95 scheme, a band of 824 to 849 MHz is used as a transmission band, and a band of 869 to 894 MHz is used as a reception band. In the PCS scheme, a band of 1920 to 1980 MHz is used as a transmission band, and a band of 2110 to 2170 MHz is used as a reception band. In the LPF 82 of the diplexer 81, values of the inductors L1 and L2 and the capacitors C1 and C2 are set so as to provide one attenuation pole in the reception band of 2110 to 2170 MHz and another one attenuation pole in the transmission band of 1920 to 1980 MHz for use in the PCS scheme. Which side, the serial resonant circuit or the parallel resonant circuit, should provide these attenuation poles is arbitrary. On the other hand, in the HPF 83 of the diplexer 81, values of the inductor L4 and the capacitor C5 are set so as to provide one attenuation pole in the band of 824 to 894 MHz for use in the IS-95 scheme.

The first duplexer 101 is made from a dielectric for separating the transmission frequency band and the reception frequency band in the IS-95 scheme from each other. The first duplexer 101 includes, for example, a band-pass filter connected to a transmission terminal Tx4, and a band-pass filter connected to a reception terminal Rx4. The first duplexer 101 is used in the IS-95 scheme, where transmission and reception are carried out simultaneously, in order to protect a reception signal from a transmission signal.

The second duplexer 102 is made from a dielectric for separating the transmission frequency band and the reception frequency band in the PCS scheme from each other. The second duplexer 102 includes, for example, a band-pass filter connected to a transmission terminal Tx5, and a band-pass filter connected to a reception terminal Rx5. The second duplexer 102 is used in the PCT scheme, where transmission and reception are also carried out simultaneously, in order to protect a reception signal from a transmission signal.

With reference to FIG. 18, the operation of the antenna duplexer 100 is described below. When the antenna duplexer 100 is supplied with a reception signal of the IS-95 scheme, the impedance of the HPF 83 becomes increased. Therefore, the reception signal is forwarded to the LPF 82 side, and is supplied to the first duplexer 101. The first duplexer 101 transfers the reception signal not to the transmission terminal Tx4 but to the reception terminal Rx4 for output. For transmission of a signal of the IS-95 scheme, on the other hand, the signal is supplied through the transmission terminal Tx4 to the first duplexer 101. The first duplexer 101 transfers the signal not to the reception terminal Rx4 but to the LPF 82. The impedance of the HPF 83 becomes increased with respect to the signal of the IS-95 scheme, and therefore the transmission signal of the IS-95 scheme is outputted from the antenna ANT.

When the antenna duplexer 100 is supplied with a reception signal of the PCS scheme, the impedance of the LPF 82 becomes increased. Therefore, the reception signal is transferred to the HPF 83 side, and is supplied to the second duplexer 102. The second duplexer 102 transfers the reception signal not to the transmission terminal Tx5 but to the reception terminal Rx5 for output. For transmission of a signal of the PCS scheme, on the other hand, the signal is supplied through the transmission terminal Tx5 to the second duplexer 102. The second duplexer 102 transfers the signal not to the reception terminal Rx5 but to the HPF 83.

The impedance of the HPF 83 becomes increased with respect to the signal of the PCS scheme, and therefore the transmission signal of the PCS scheme is outputted from the antenna ANT.

As described above, when the antenna duplexer according to the fourth embodiment is used, it is possible, even in a communications system using the IS-95 scheme and the PCS scheme, to pass a signal of the high frequency band without being attenuated over a wide frequency band. In the PCS scheme, since the transmission band and the reception band are far apart from each other, it is very effective to use a diplexer capable of providing two attenuation poles in the low-pass filter as in the present invention.

By using the high-frequency switch according to the third embodiment and the antenna duplexer according to the fourth embodiment, a wireless communications device capable of transmitting and receiving a signal of a communications system using a plurality of frequency bands can be provided.

While the invention has been described in detail, the foregoing description is in all aspects illustrative and not restrictive. It is understood that numerous other modifications and variations can be devised without departing from the scope of the invention.

What is claimed is:

1. A diplexer for multiplexing and demultiplexing radio waves of different frequency bands, comprising:
   a low-pass filter placed between a first terminal connected to an antenna side and a second terminal for transmitting and receiving a signal of a low frequency band, the low-pass filter passing only the signal of a low frequency band; and
   a high-pass filter placed between the first terminal and a third terminal for transmitting and receiving a signal of the high frequency band, the high-pass filter passing only the signal of the high frequency band, wherein
   the low-pass filter includes at least two resonant circuits to provide at least two attenuation poles at a high-frequency side of a passband.

2. The diplexer according to claim 1, wherein
   the high-pass filter further includes a single resonant circuit, and
   the high-pass filter provides an attenuation pole at a low-frequency side of a passband, whereby
   the low-pass filter passes only a signal of a frequency band that is lowest of the different frequency bands.

3. The diplexer according to claim 2, wherein
   the low-pass filter includes, as the two resonant circuits:
   a parallel resonant circuit formed by a first inductor and a first capacitor that are placed between the first terminal and the second terminal; and
   a serial resonant circuit formed by a second inductor and a second capacitor that are placed between the second terminal and a ground.

4. The diplexer according to claim 3, wherein
   the high-pass filter further includes a serial circuit formed by a third capacitor and a fourth capacitor that are placed between the first terminal and the third terminal, and
   the high-pass filter includes, as the resonant circuit, a serial resonant circuit formed by a third inductor and a fifth capacitor that are placed between a point of connection of the third capacitor and the fourth capacitor, and the ground.

5. The diplexer according to claim 4, wherein
   the low-pass filter and the high-pass filter are formed by a lamination body obtained by laminating a plurality of dielectric layers including a plurality of strip line electrodes for implementing the first through third inductors, a plurality of capacitor electrodes for implementing the first through fifth capacitors, and a plurality of conductive via holes for connecting the strip line electrodes and the capacitor electrodes.

6. The diplexer according to claim 5, wherein
   at least one of the dielectric layers includes a ground electrode, and
   at least one strip line electrode for implementing the first inductor is placed on a dielectric layer that is upper in a lamination direction than a dielectric layer having the ground electrode placed thereon and is equal to or upper in the lamination direction than a dielectric layer having at least one strip line electrode placed thereon and a dielectric layer having at least one strip line electrode for implementing the third inductor placed thereon.

7. The diplexer according to claim 5, wherein
   at least one of the dielectric layers includes a ground electrode,
   at least one strip line electrode for implementing the first capacitor in the parallel resonant circuit of the low-pass filter is placed on a dielectric layer that is upper in a lamination direction than a dielectric layer having the ground electrode placed thereon, and
   at least one strip line electrode for implementing the first inductor in the parallel resonant circuit of the low-pass filter is placed on a dielectric layer upper in the lamination direction than a dielectric layer having the capacitor electrode.

8. The multiplexer according to claim 5, wherein
   at least one of the dielectric layers includes a ground electrode,
   at least one capacitor electrode for implementing the second capacitor in the serial resonant circuit of the low-pass filter is placed on a dielectric layer upper in a lamination direction than a dielectric layer having the ground electrode placed thereon, and
   at least one strip line electrode for implementing the second inductor in the serial resonant circuit of the low-pass filter is placed on a dielectric layer upper in the lamination direction than a dielectric layer having the capacitor electrode.

9. The diplexer according to claim 5, wherein
   at least one of the dielectric layers includes a ground electrode,
   at least one capacitor electrode for implementing the fifth capacitor in the serial resonant circuit of the high-pass filter is placed on a dielectric layer upper in a lamination direction than a dielectric layer having the ground electrode placed thereon, and
   at least one strip line electrode for implementing the third inductor in the serial resonant circuit of the high-pass filter is placed on a dielectric layer upper in the lamination direction than a dielectric layer having the capacitor electrode placed thereon.

10. A high-frequency switch for switching transmission and reception of radio waves of different frequency bands, comprising:
    a diplexer for transmitting and receiving the radio waves of the different frequency bands via a first terminal connected to an antenna side for multiplexing and demultiplexing the radio waves;

a low-frequency transmission and reception switching circuit connected to a second terminal included in the diplexer for transmitting and receiving a signal of a low frequency band; and a high-frequency transmission and reception switching circuit connected to a third terminal included in the diplexer for transmitting and receiving a signal of a high frequency band, the diplexer including:
- a low-pass filter placed between the first terminal and the second terminal for passing only the signal of the low frequency band; and
- a high-pass filter placed between the first terminal and the third terminal for passing only the signal of the high frequency band, and the low-pass filter having at least two resonant circuits to provide at least two attenuation poles at a high-frequency side of a passband.

11. The high-frequency switch according to claim 10, wherein the high-pass filter includes a single resonant circuit,
the high-pass filter provides a single attenuation pole, and
the low-pass filter passes only a signal of lowest frequencies.

12. The high-frequency switch according to claim 11, wherein the low-pass filter includes, as the two resonant circuits:
- a parallel resonant circuit formed by a first inductor and a first capacitor that are placed between the first terminal and the second terminal; and
- a serial resonant circuit formed by a second inductor and a second capacitor that are placed between the second terminal and a ground.

13. The high-frequency switch according to claim 12, wherein the high-pass filter further includes a serial circuit formed by a third capacitor and a fourth capacitor that are placed between the first terminal and the third terminal, and the high-pass filter includes, as the resonant circuit, a serial resonant circuit formed by a third inductor and a fifth capacitor that are placed between a point of connection of the third capacitor and the fourth capacitor and the ground.

14. The high-frequency switch according to claim 13, wherein the high-frequency switch is formed by a lamination body obtained by laminating a plurality of dielectric layers including a plurality of strip line electrodes for implementing the inductors, a plurality of capacitor electrodes for implementing the capacitors, and a plurality of conductive via holes for connecting the strip line electrodes and the capacitor electrodes.

15. The high-frequency switch according to claim 14, wherein the lamination body includes the plurality of strip line electrodes for implementing the first through third inductors, the plurality of capacitor electrodes for implementing the first through fifth capacitors, and the plurality of conductive via holes for connecting the strip line electrodes and the capacitor electrodes to implement the low-pass filter and the high-pass filter.

16. The high-frequency switch according to claim 15, wherein at least one of the dielectric layers includes a ground electrode, and at least one of the strip line electrodes for implementing the first inductor is placed on a dielectric layer that is upper in a lamination direction than a dielectric layer having the ground electrode placed thereon and is equal to or upper in the lamination direction than a dielectric layer having at least one of the strip line electrodes placed thereon and a dielectric layer having at least one of the strip line electrodes for implementing the third inductor placed thereon.

17. The high-frequency switch according to claim 15, wherein at least one of the dielectric layers includes a ground electrode, at least one of the strip line electrodes for implementing the first capacitor in the parallel resonant circuit of the low-pass filter is placed on a dielectric layer that is upper in a lamination direction than a dielectric layer having the ground electrode placed thereon, and at least one of the strip line electrodes for implementing the first inductor in the parallel resonant circuit of the low-pass filter is placed on a dielectric layer upper in the lamination direction than a dielectric layer having the capacitor electrode.

18. The high-frequency switch according to claim 15, wherein at least one of the dielectric layers includes a ground electrode, at least one of the capacitor electrodes for implementing the second capacitor in the serial resonant circuit of the low-pass filter is placed on a dielectric layer upper in a lamination direction than a dielectric layer having the ground electrode placed thereon, and at least one of the strip line electrodes for implementing the second inductor in the serial resonant circuit of the low-pass filter is placed on a dielectric layer upper in the lamination direction than a dielectric layer having the capacitor electrode.

19. The high-frequency switch according to claim 15, wherein at least one of the dielectric layers includes a ground electrode, at least one of the capacitor electrodes for implementing the fifth capacitor in the serial resonant circuit of the high-pass filter is placed on a dielectric layer upper in a lamination direction than a dielectric layer having the ground electrode placed thereon, and at least one of the strip line electrodes for implementing the third inductor in the serial resonant circuit of the high-pass filter is placed on a dielectric layer upper in the lamination direction than a dielectric layer having the capacitor electrode placed thereon.

20. The high-frequency switch according to claim 14, wherein at least one of the low-frequency transmission and reception switching circuit and the high-frequency transmission and reception switching circuit is a circuit for switching transmission and reception based on a voltage applied to diodes, and the diodes are placed on a top surface of the lamination body.

21. The high-frequency switch according to claim 14, wherein at least one of the low-frequency transmission and reception switching circuit and the high-frequency transmission and reception switching circuit is a GaAs switch, and the GaAs switch is placed on a top surface of the lamination body.

22. An antenna duplexer for simultaneously carrying out transmission and reception of radio waves of different frequency bands, comprising:
   a diplexer for transmitting and receiving the radio waves of the different frequency bands via a first terminal connected to an antenna side for multiplexing and demultiplexing the radio waves;
   a first duplexer connected to a second terminal included in the diplexer for transmitting and receiving a signal of a low frequency band; and
   a second duplexer connected to a third terminal included in the diplexer for transmitting and receiving a signal of a high frequency band;
   the diplexer including:
      a low-pass filter placed between the first terminal and the second terminal for passing only the signal of the low frequency band; and
      a high-pass filter placed between the first terminal and the third terminal for passing only the signal of the high frequency band, and
   the low pass filter having at least two resonant circuits to provide at least two attenuation poles at a high-frequency side of a passband.

23. The antenna duplexer according to claim 22, wherein the high-pass filter includes a single resonant circuit, the high-pass filter provides a single attenuation pole, and the low-pass filter passes only a signal of lowest frequencies.

24. The antenna duplexer according to claim 23, wherein the low-pass filter includes, as the two resonant circuits:
   a parallel resonant circuit formed by a first inductor and a first capacitor that are placed between the first terminal and the second terminal; and
   a serial resonant circuit formed by a second inductor and a second capacitor that are placed between the second terminal and a ground.

25. The antenna duplexer according to claim 24, wherein the high-pass filter further includes a serial circuit formed by a third capacitor and a fourth capacitor that are placed between the first terminal and the third terminal, and
   the high-pass filter includes, as the resonant circuit, a serial resonant circuit formed by a third inductor and a fifth capacitor that are placed between a point of connection of the third capacitor and the fourth capacitor and the ground.

26. The antenna duplexer according to claim 25, wherein the high-frequency switch is formed by a lamination body obtained by laminating a plurality of dielectric layers including a plurality of strip line electrodes for implementing the inductors, a plurality of capacitor electrodes for implementing the capacitors, and a plurality of conductive via holes for connecting the strip line electrodes and the capacitor electrodes.

27. A wireless communications device for carrying out transmission and reception of radio waves of different frequency bands, comprising a high-frequency switch for switching the transmission and reception of the radio waves of the different frequency bands,
the high-frequency switch including:
   a diplexer for transmitting and receiving the radio waves of the different frequency bands via a first terminal connected to an antenna side for multiplexing and demultiplexing the radio waves;
   a low-frequency transmission and reception switching circuit connected to a second terminal included in the diplexer for transmitting and receiving a signal of a low frequency band; and
   a high-frequency transmission and reception switching circuit connected to a third terminal included in the diplexer for transmitting and receiving a signal of a high frequency band,
   the diplexer including:
      a low-pass filter placed between the first terminal and the second terminal for passing only the signal of the low frequency band; and
      a high-pass filter placed between the first terminal and the third terminal for passing only the signal of the high frequency band, and
   the low-pass filter having at least two resonant circuits to provide at least two attenuation poles (AP1, AP2) at a high-frequency side of a passband.

28. A wireless communications device for carrying out transmission and reception of radio waves of different frequency bands, comprising
   an antenna duplexer for simultaneously carrying out transmission and reception of radio waves of different frequency bands,
   the antenna duplexer including:
   a diplexer for transmitting and receiving the radio waves of the different frequency bands via a first terminal connected to an antenna side for multiplexing and demultiplexing the radio waves;
   a first duplexer connected to a second terminal included in the diplexer for transmitting and receiving a signal of a low frequency band; and
   a second duplexer connected to a third terminal included in the diplexer for transmitting and receiving a signal of a high frequency band,
   the diplexer including:
      a low-pass filter placed between the first terminal and the second terminal for passing only the signal of the low frequency band; and
      a high-pass filter placed between the first terminal and the third terminal for passing only the signal of the high frequency band, and
   the low pass filter having at least two resonant circuits to provide at least two attenuation poles at a high-frequency side of a passband.

* * * * *